US012575115B2

(12) United States Patent
    Kobayashi

(10) Patent No.: US 12,575,115 B2
(45) Date of Patent: Mar. 10, 2026

(54) SEMICONDUCTOR MEMORY DEVICE

(71) Applicant: Kioxia Corporation, Tokyo (JP)

(72) Inventor: Shigeki Kobayashi, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 440 days.

(21) Appl. No.: 18/165,390

(22) Filed: Feb. 7, 2023

(65) Prior Publication Data

US 2023/0180488 A1 Jun. 8, 2023

Related U.S. Application Data

(63) Continuation of application No. PCT/JP2020/035256, filed on Sep. 17, 2020.

(51) Int. Cl.
H10B 69/00 (2023.01)

(52) U.S. Cl.
CPC ................................... H10B 69/00 (2023.02)

(58) Field of Classification Search
CPC ........ H10B 69/00; H10B 12/31; H10B 43/27; H10B 43/00–50; G11C 11/406; G11C 16/10; G11C 16/14; G11C 11/005; G11C 11/4091; G11C 11/4094; G11C 16/0483; G11C 16/0466–0475; G11C 27/005; G11C 11/5671; H10D 1/60–716
See application file for complete search history.

(56) References Cited

U.S. PATENT DOCUMENTS

| | | | | |
|---|---|---|---|---|
| 5,623,442 | A * | 4/1997 | Gotou | G11C 11/005 |
| | | | | 365/185.24 |
| 7,372,730 | B2 | 5/2008 | Chen | |
| 10,658,057 | B2 | 5/2020 | Maeda | |
| 2004/0212005 | A1 | 10/2004 | Lojek | |
| 2012/0314482 | A1 | 12/2012 | Takemura | |
| 2015/0078086 | A1 | 3/2015 | Lee | |
| 2020/0075621 | A1* | 3/2020 | Nakaki | H10D 64/037 |
| 2020/0090779 | A1* | 3/2020 | Tokutomi | G11C 29/025 |
| 2020/0273876 | A1* | 8/2020 | Kashima | H10B 43/35 |
| 2020/0286910 | A1* | 9/2020 | Kashima | H10B 41/35 |

FOREIGN PATENT DOCUMENTS

| | | |
|---|---|---|
| JP | H0778484 A | 3/1995 |
| JP | 2020047347 A | 3/2020 |
| TW | 200532758 A | 10/2005 |
| TW | 201737421 A | 10/2017 |

OTHER PUBLICATIONS

International Search Report (ISR) (and English language translation thereof) dated Nov. 17, 2020, issued in International Application No. PCT/JP2020/035256.

* cited by examiner

*Primary Examiner* — Shahed Ahmed
(74) *Attorney, Agent, or Firm* — Holtz, Holtz & Volek PC

(57) ABSTRACT

According to one embodiment, a semiconductor memory device includes: a first bit line; a first memory cell transistor coupled to the first bit line; and a first capacitor coupled between the first memory cell transistor and the first bit line.

16 Claims, 34 Drawing Sheets

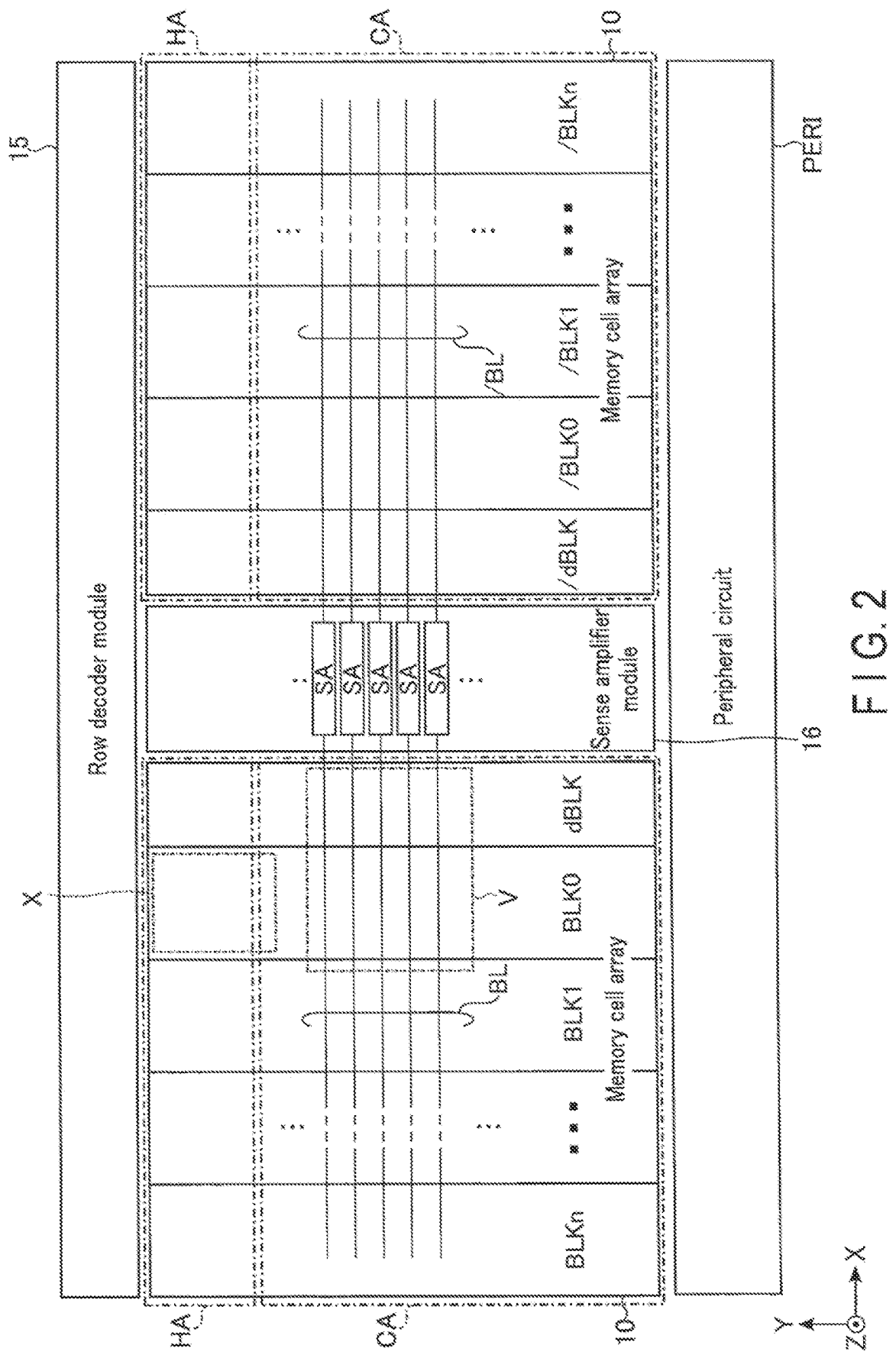
F I G. 2

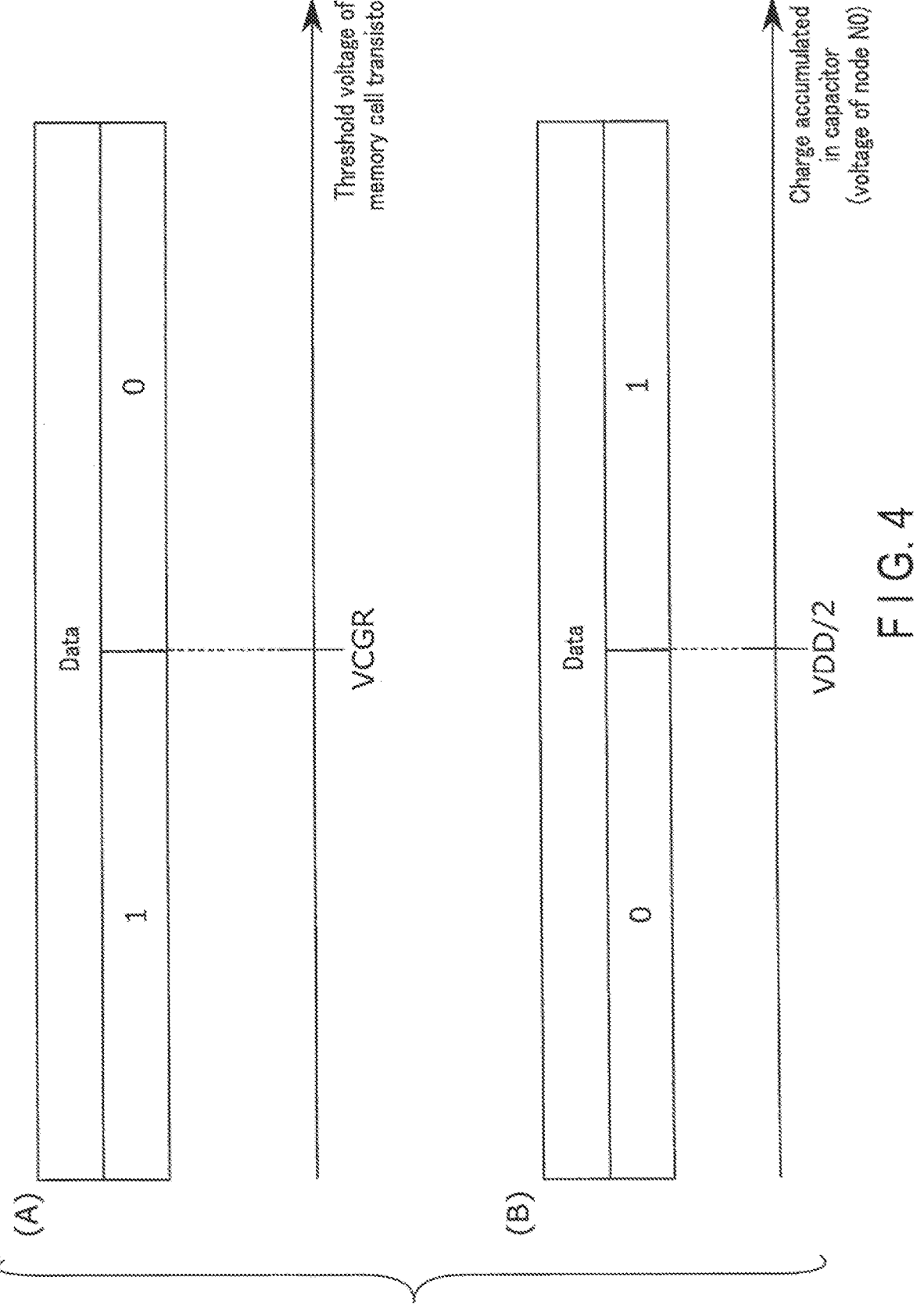
F I G. 4

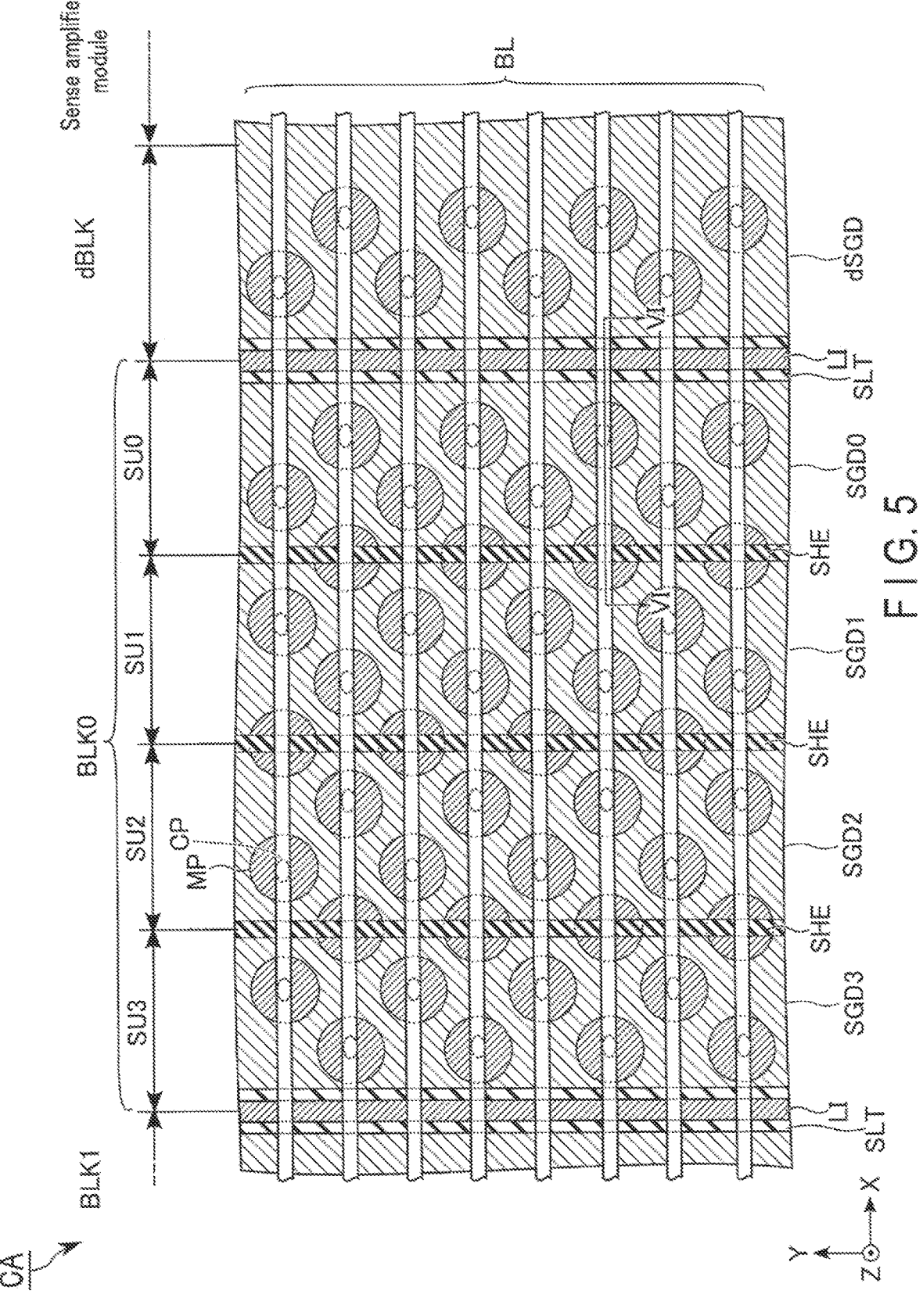
F I G. 5

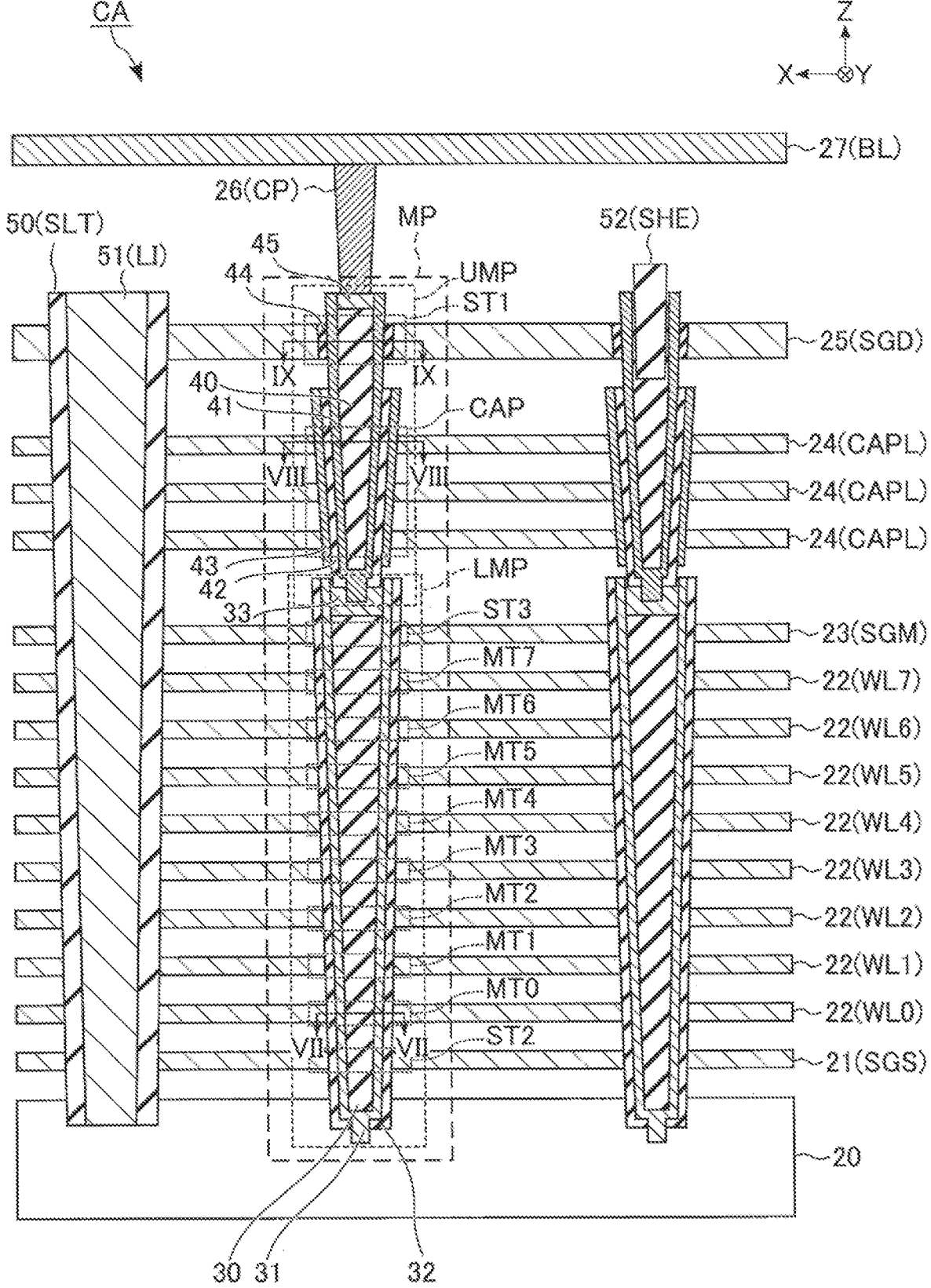
F I G. 6

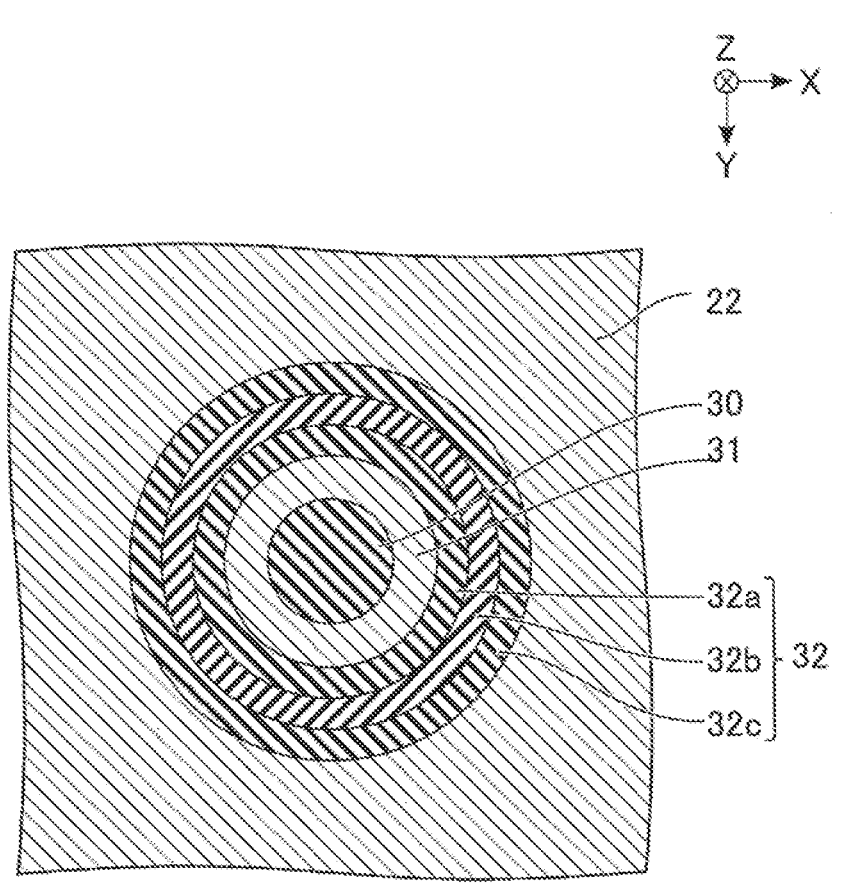
F I G. 7

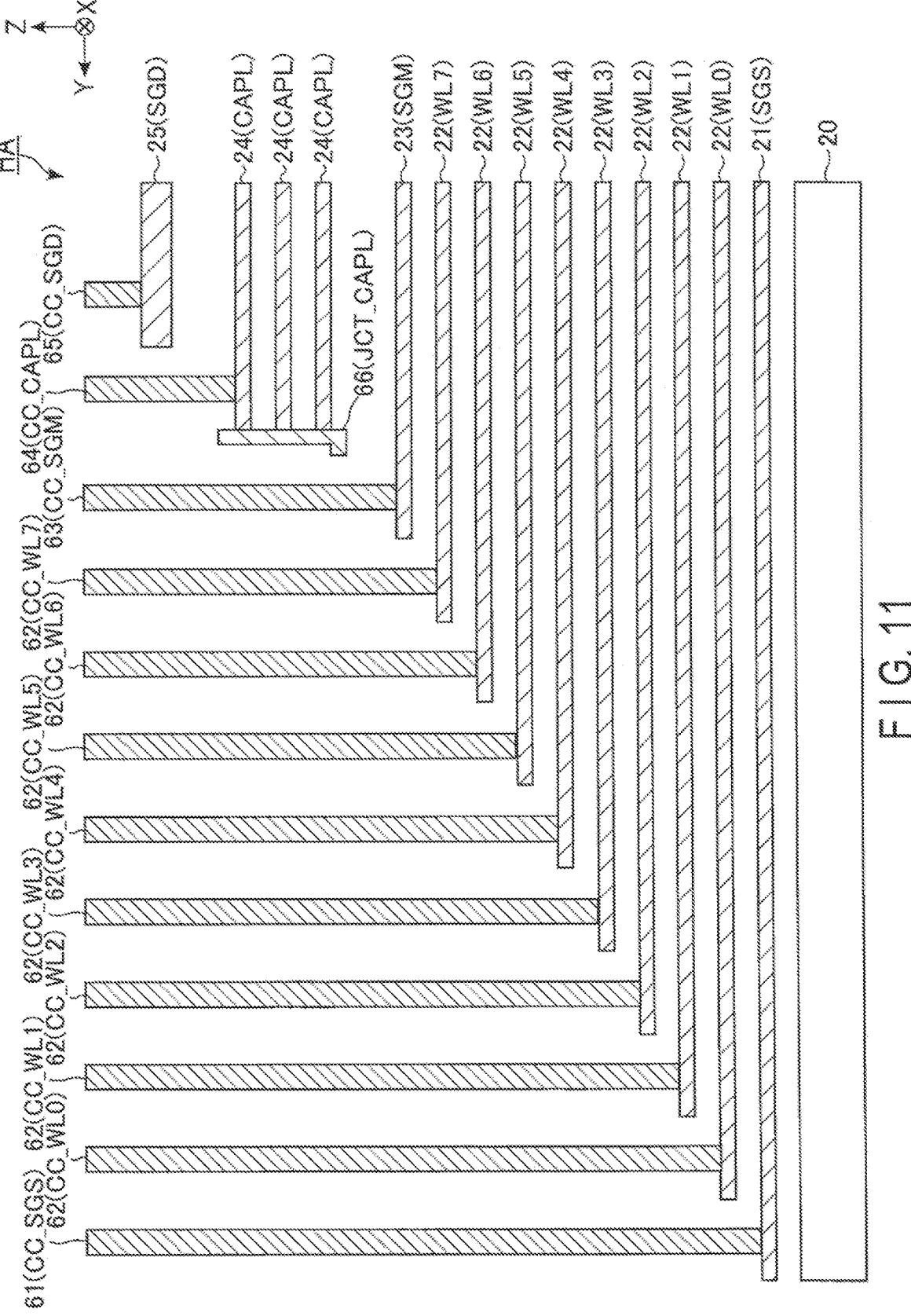
F I G. 11

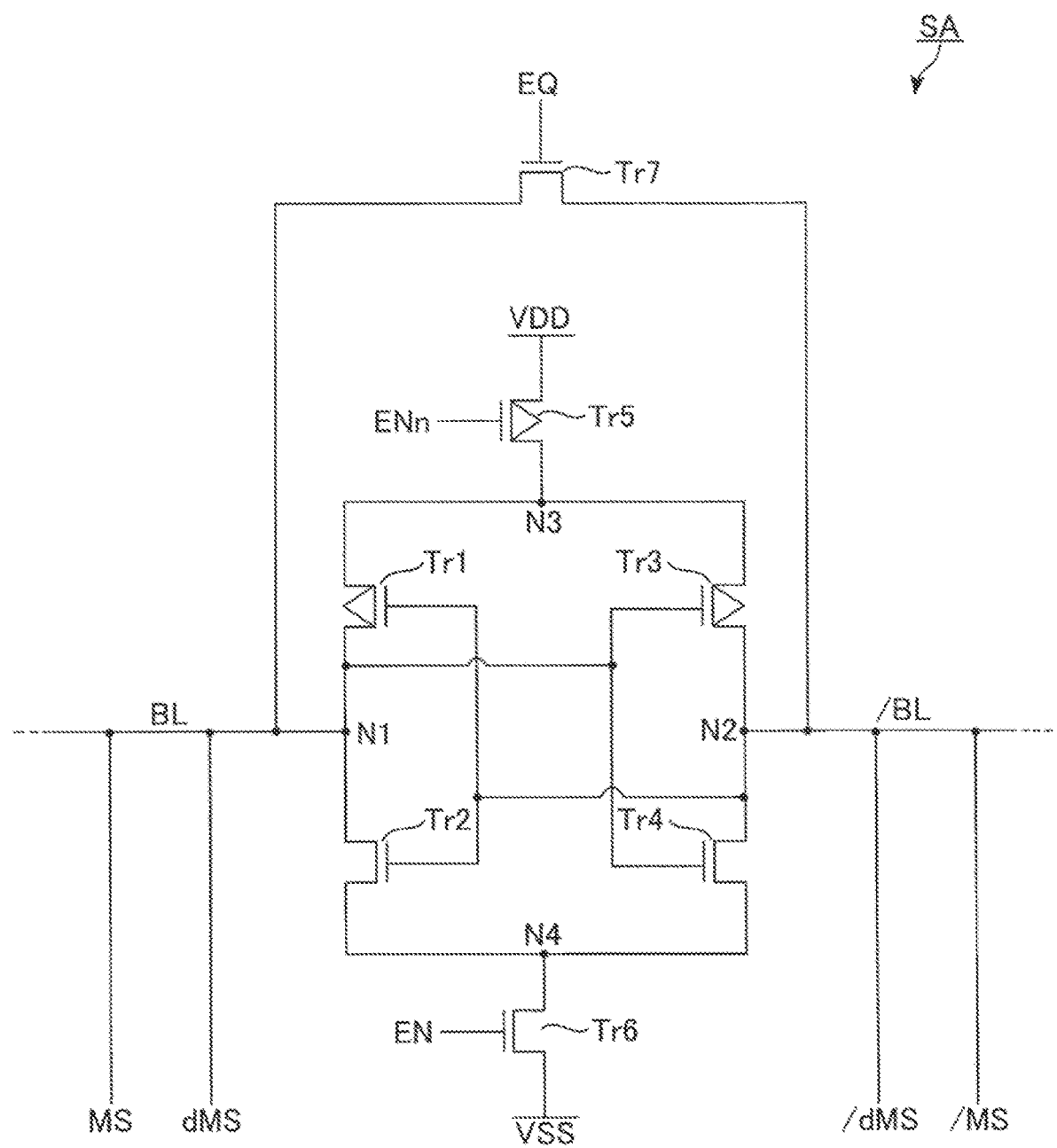
F I G. 12

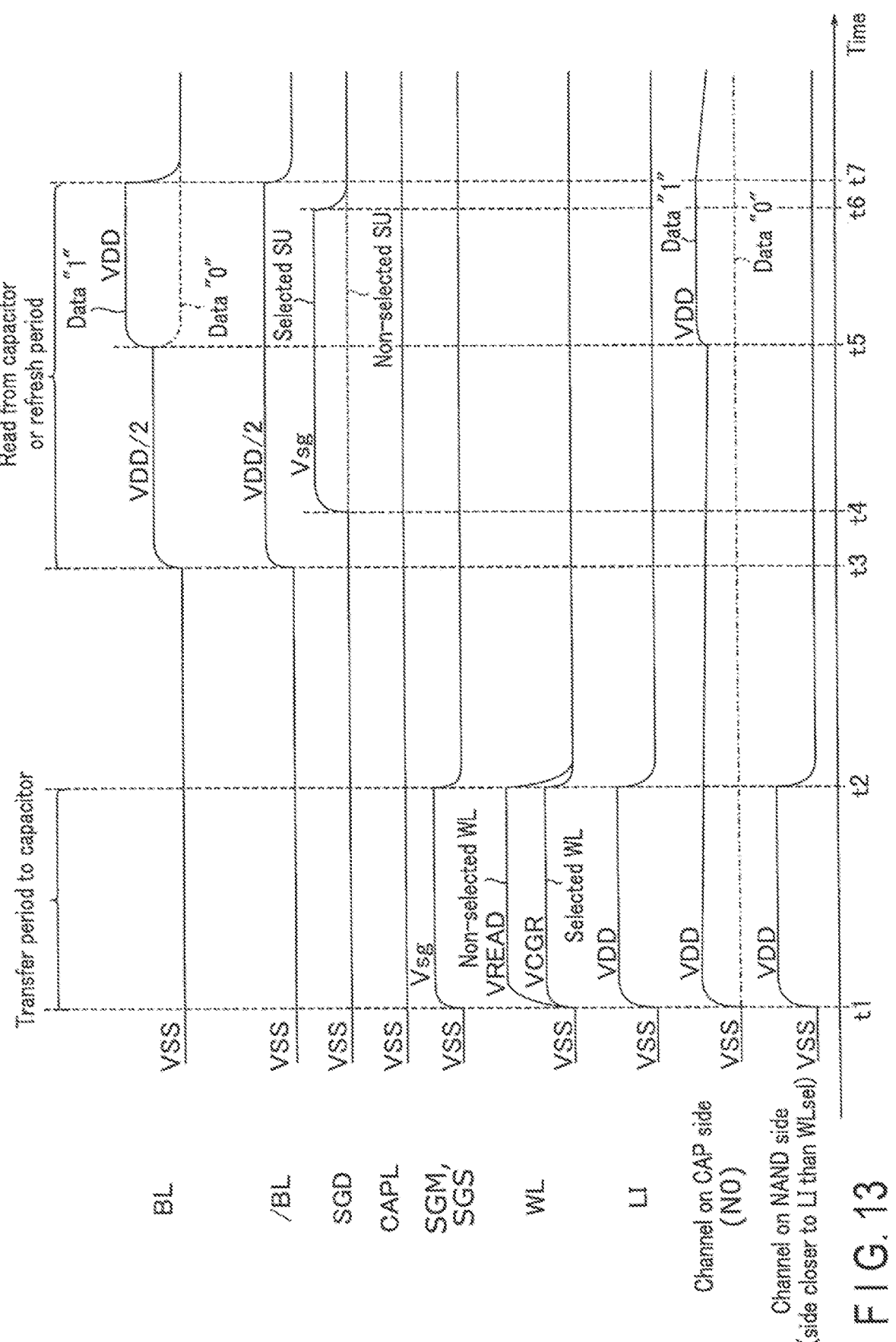
F I G. 13

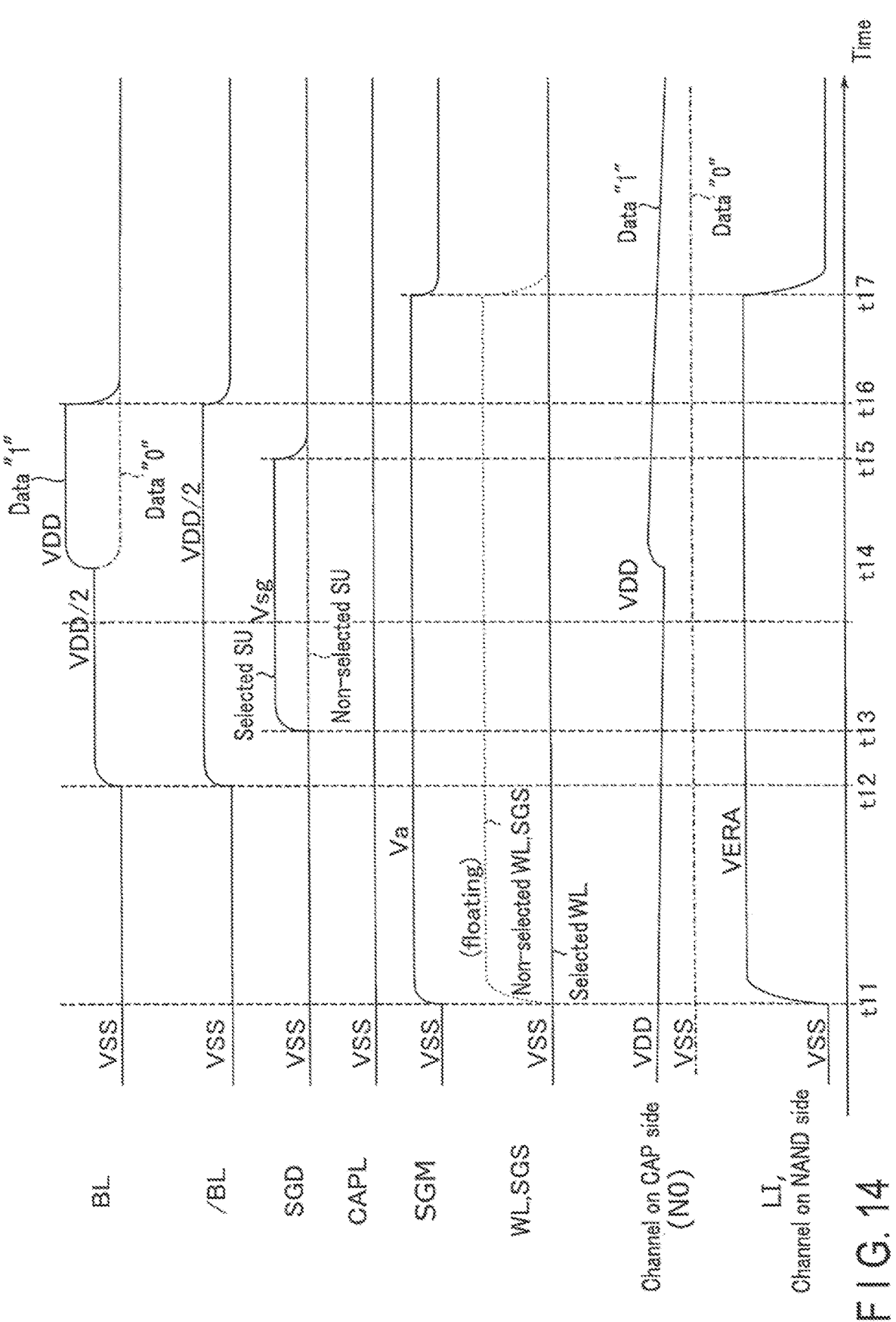
F I G. 14

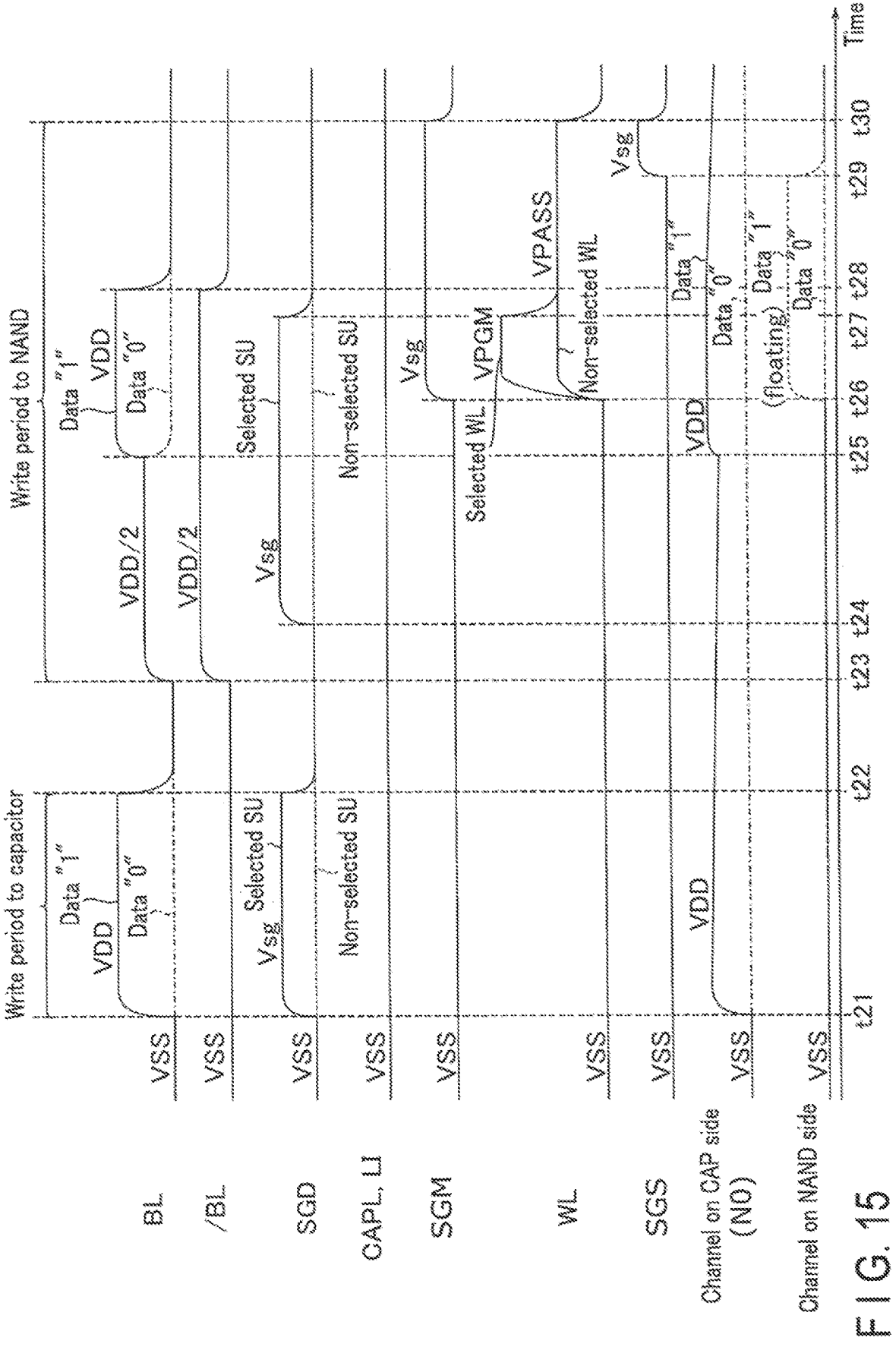
F I G. 15

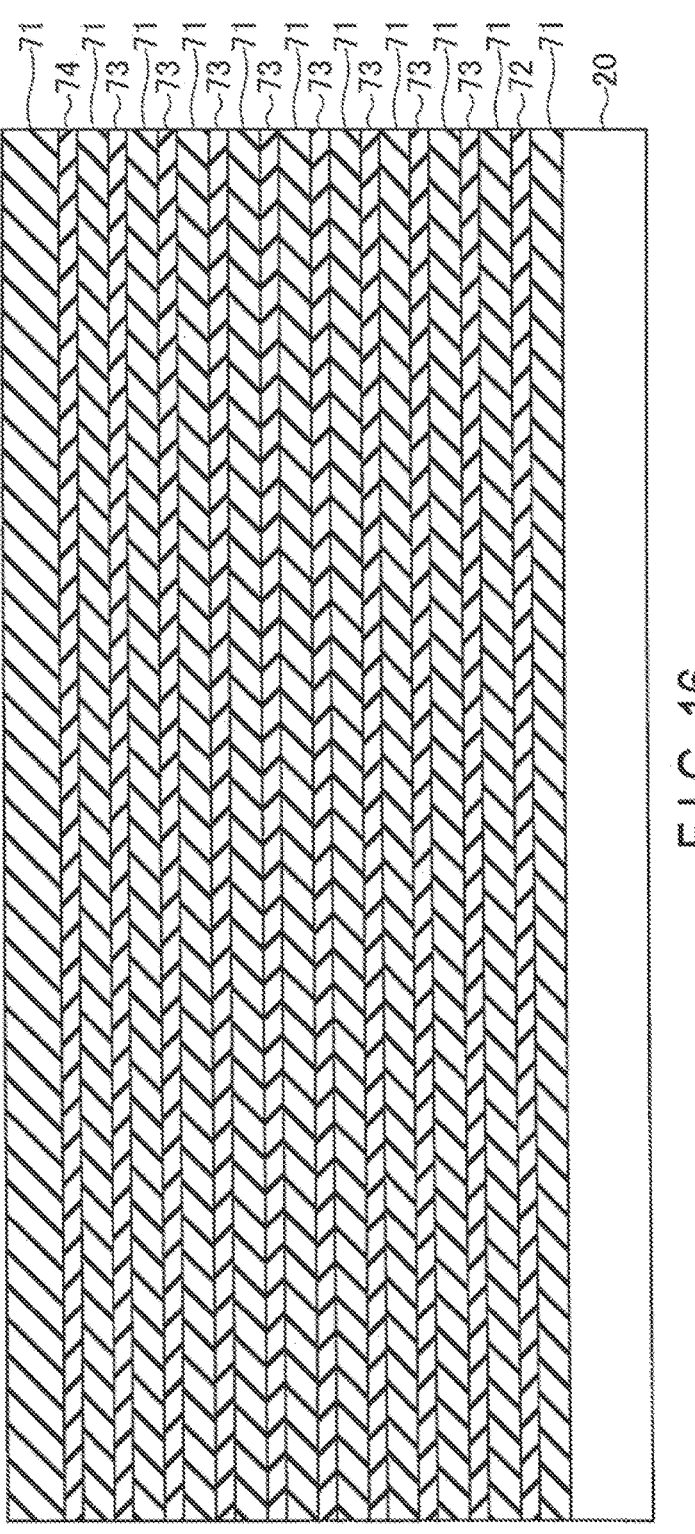
F I G. 16

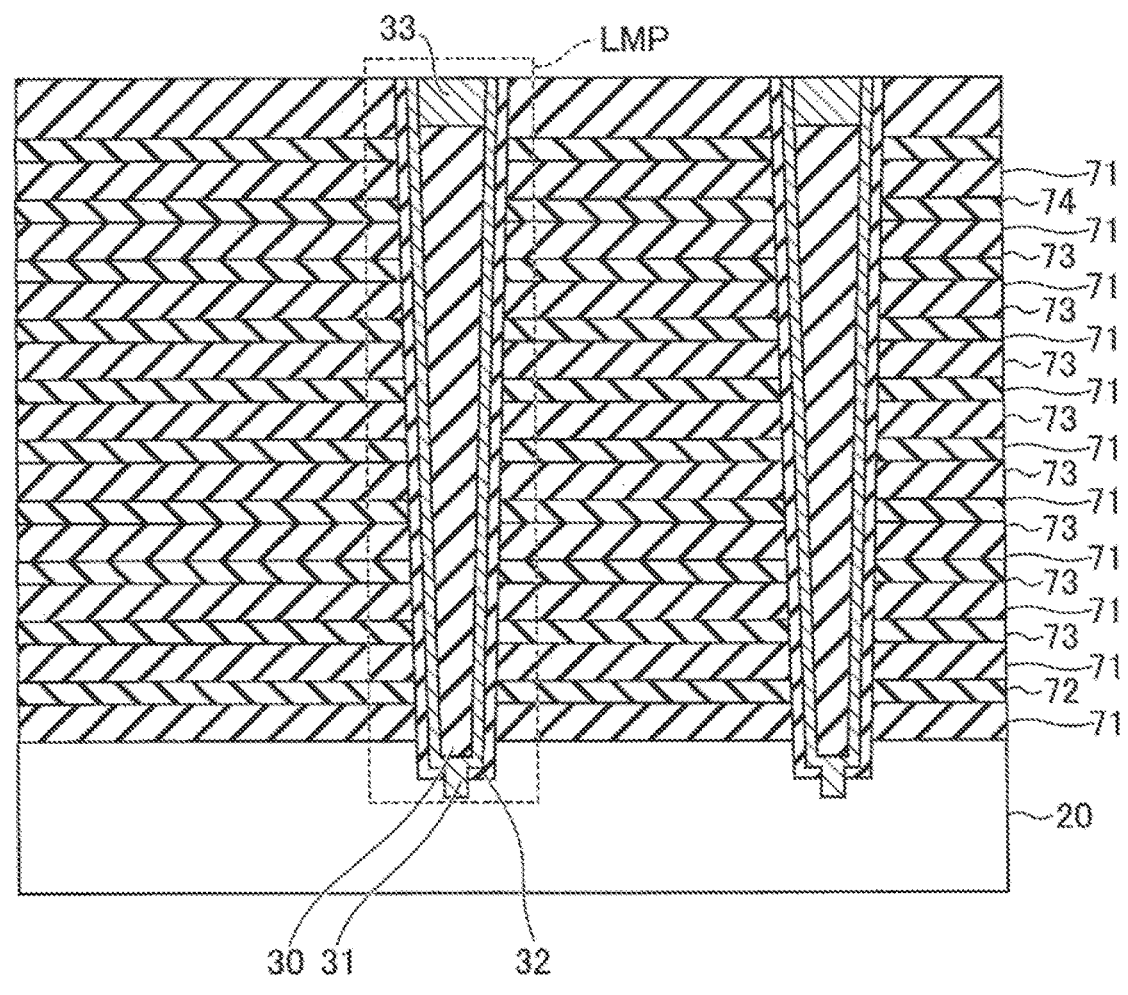
F I G. 18

F I G. 20

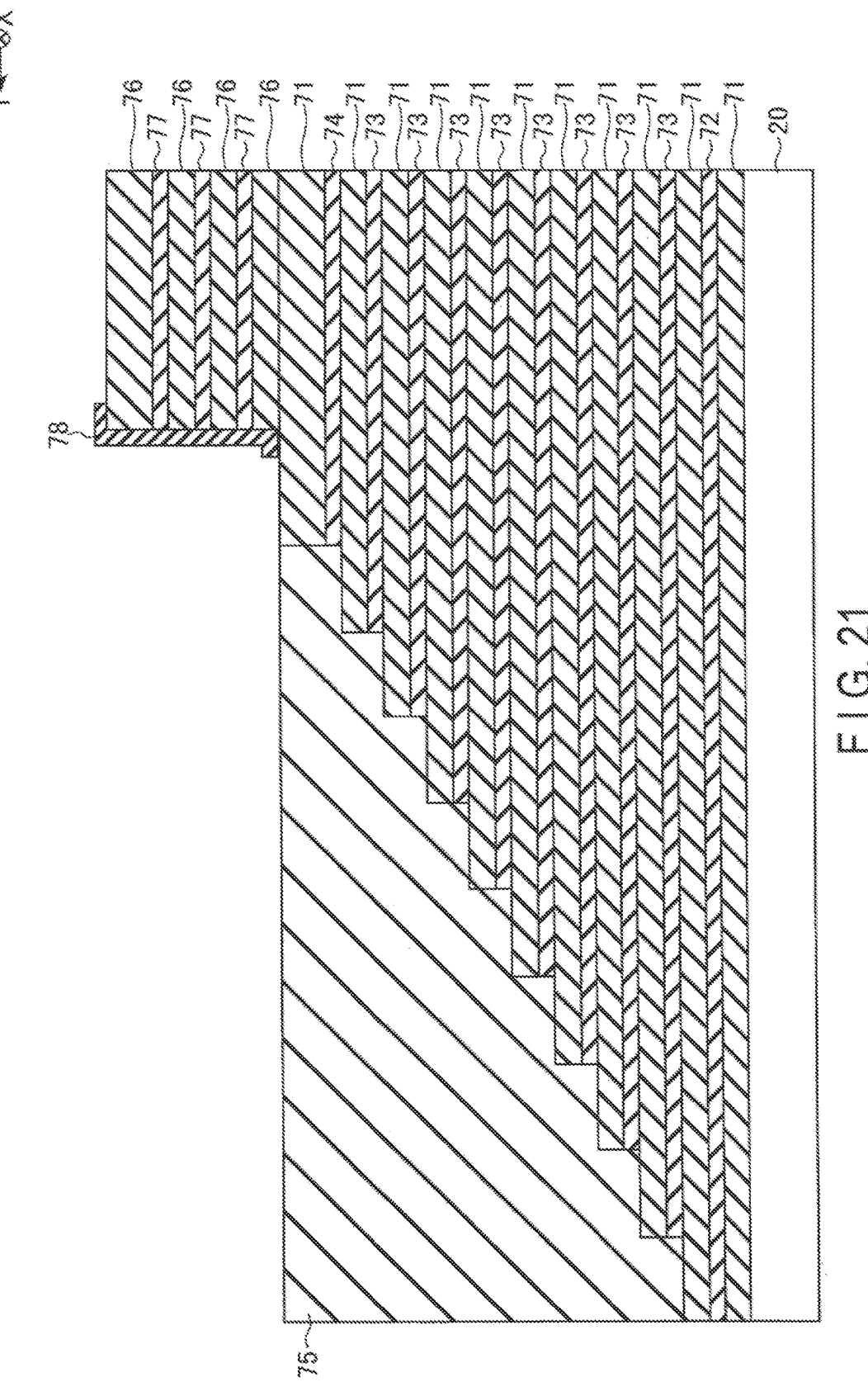
F I G. 21

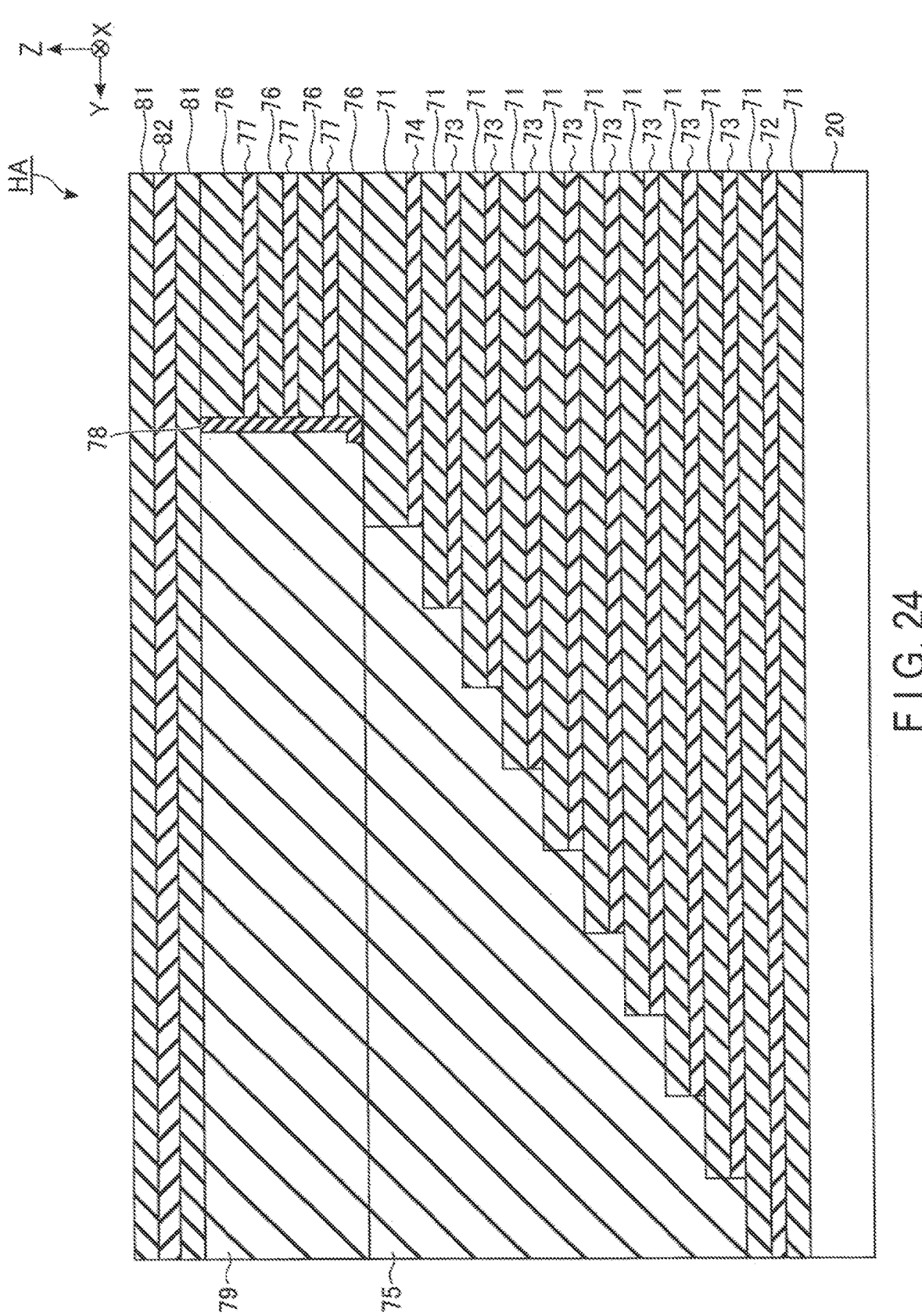
F I G. 24

F I G. 32

F I G. 33

SEMICONDUCTOR MEMORY DEVICE

CROSS-REFERENCE TO RELATED APPLICATIONS

This application is a Continuation Application of PCT Application No. PCT/JP2020/035256, filed Sep. 17, 2020, the entire contents of which are incorporated herein by reference.

FIELD

Embodiments described herein relate generally to a semiconductor memory device a first bit line;
a first memory cell transistor coupled to the first bit line; and a first capacitor coupled between the first memory cell transistor and the first bit line.

BACKGROUND

A NAND flash memory is known as a semiconductor memory device capable of storing data in a non-volatile manner. Also, a DRAM (Dynamic random access memory) is known as a semiconductor memory device capable of storing data in a volatile manner and enabling high-speed data write and read.

BRIEF DESCRIPTION OF THE DRAWINGS

FIG. 2 is a plan view for illustrating a planar layout of the semiconductor memory device according to the embodiment.

FIG. 4 is a diagram for illustrating data stored in a memory cell transistor and a capacitor according to the embodiment.

FIG. 5 is a plan view of a cell area of region V shown in FIG. 2.

FIG. 6 is a cross-sectional view of the cell area taken along line VI-VI shown in FIG. 5.

FIG. 7 is a sectional view of the memory cell transistor taken along line VII-VII shown in FIG. 6.

FIG. 11 is a cross-sectional view of the hookup area taken along line XI-XI shown in FIG. 10.

FIG. 12 is a circuit diagram for illustrating a configuration of a sense amplifier of the semiconductor memory device according to the embodiment.

FIG. 13 is a timing chart illustrating a read operation in the semiconductor memory device according to the embodiment.

FIG. 14 is a timing chart for illustrating an erase operation in the semiconductor memory device according to the embodiment.

FIG. 15 is a timing chart for illustrating a write operation in the semiconductor memory device according to the embodiment.

FIG. 16 is a cross-sectional view of a memory cell array for illustrating a manufacturing process of the semiconductor memory device according to the embodiment.

FIG. 18 is a cross-sectional view of the memory cell array for illustrating the manufacturing process of the semiconductor memory device according to the embodiment.

FIG. 20 is a cross-sectional view of the memory cell array for illustrating the manufacturing process of the semiconductor memory device according to the embodiment.

FIG. 21 is a cross-sectional view of the memory cell array for illustrating the manufacturing process of the semiconductor memory device according to the embodiment.

FIG. 24 is a cross-sectional view of the memory cell array for illustrating the manufacturing process of the semiconductor memory device according to the embodiment.

FIG. 32 is a cross-sectional view of the memory cell array for illustrating the manufacturing process of the semiconductor memory device according to the embodiment.

FIG. 33 is a cross-sectional view of the memory cell array for illustrating the manufacturing process of the semiconductor memory device according to the embodiment.

DETAILED DESCRIPTION

Figure 1:
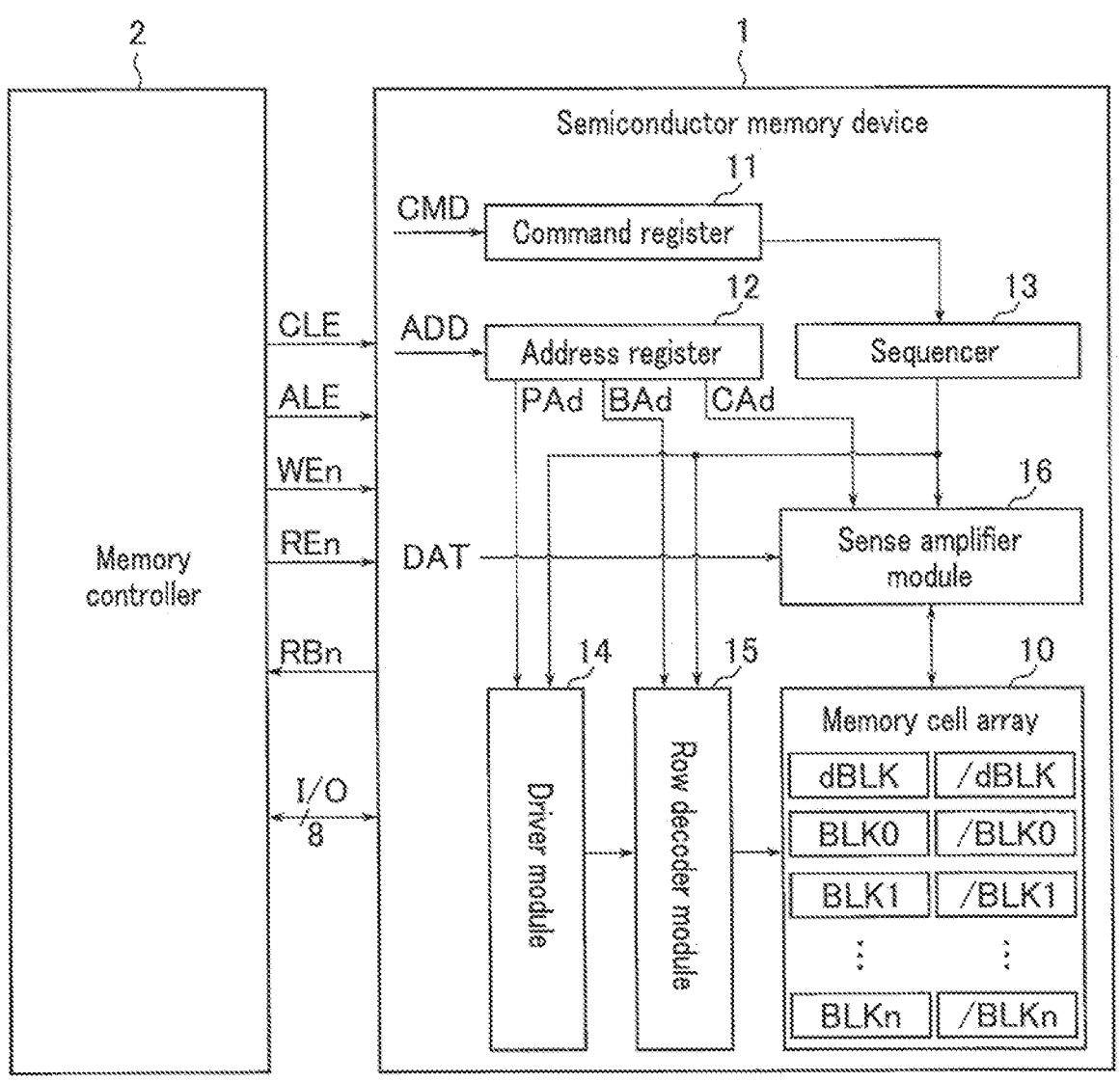
FIG. 1 is a block diagram for illustrating a configuration of a memory system including a semiconductor memory device according to an embodiment.

In general, according to one embodiment, a semiconductor memory device includes: a first bit line;
a first memory cell transistor coupled to the first bit line; and a first capacitor coupled between the first memory cell transistor and the first bit line.

A description will now be given of embodiments with reference to the accompanying drawings. Each embodiment illustrates a device and a method for embodying the technical idea of the invention. The drawings are schematic or conceptual, and the dimensions and scales of the drawings are not necessarily the same as actual products. The technical concept underlying the present invention is not limited by the shapes, structures, arrangements, etc. of the constituent elements.

In the description set forth below, components having substantially the same function and configuration will be denoted by the same reference numerals including letters or numerals. Where elements denoted by the same reference numerals and having similar configurations have to be discriminated from each other, letters or numerals may be added after the reference numerals.

In addition, it is assumed that component "/A" is an element having the same configuration as element A and forming a pair with element A.

1. EMBODIMENTS

Semiconductor memory devices according to embodiments will be described.

1.1 Configuration

First, a configuration of a semiconductor memory device according to an embodiment will be described.

1.1.1 Overall Configuration

FIG. 1 is a block diagram for illustrating an overall configuration of a memory system including the semiconductor memory device according to the embodiment. The semiconductor memory device 1 includes a NAND flash memory capable of storing data in a non-volatile manner and a DRAM (Dynamic random access memory) capable of storing data in a volatile manner. The semiconductor memory device 1 is controlled by an external memory controller 2. In the example shown in FIG. 1, communications between the semiconductor memory device 1 and the memory controller 2 support, for example, the NAND interface standard, but are not necessarily limited to this. For example, communications between the semiconductor memory device 1 and the memory controller 2 can further support an interface standard enabling communications with DRAMs.

As shown in FIG. 1, the semiconductor memory device 1 includes, for example, a memory cell array 10, a command register 11, an address register 12, a sequencer 13, a driver module 14, a row decoder module 15 and a sense amplifier module 16. Of the components of the semiconductor memory device 1, the components other than the memory cell array 10, the row decoder module 15 and the sense amplifier module 16 (namely, the command register 11, the address register 12, the sequencer 13 and the driver module 14) are also referred to as peripheral circuits PERI.

The memory cell array 10 includes a plurality of blocks BLK0 to BLKn and /BLK0 to /BLKn (n is an integer of 1 or more) and two dummy blocks dBLK and /dBLK. The blocks BLK and /BLK are sets including a plurality of DRAM memory cells and a plurality of NAND memory cells capable of storing data in a non-volatile manner, and are used as units for data erasing, for example. In the description below, the DRAM memory cells and the NAND memory cells may be generally referred to simply as "memory cells" for the sake of simplicity. The dummy blocks dBLK and /dBLK function as reference capacitors for the blocks BLK and /BLK.

A memory cell array 10 is provided with a plurality of bit lines, a plurality of word lines and a plurality of select gate lines. Each DRAM memory cell is associated, for example, with one bit line and one select gate line. Each NAND memory cell is associated, for example, with one bit line and one word line. A detailed configuration the memory cell array 10 will be described later.

The command register 11 stores a command CMD which the semiconductor memory device 1 receives from the memory controller 2. The command CMD includes, for example, instructions for causing the sequencer 13 to perform a read operation, a write operation, an erase operation, etc.

The address register 12 stores address information ADD which the semiconductor memory device 1 receives from the memory controller 2. The address information ADD includes, for example, a block address BAd, a page address PAd and a column address CAd. For example, the block address BAd, the page address PAd and the column address CAd are used to select a block BLK, a word line, a select gate line and a bit line, respectively.

The sequencer 13 controls the overall operation of the semiconductor memory device 1. For example, the sequencer 13 controls the driver module 14, the row decoder module 15, the sense amplifier module 16 etc., based on the command CMD stored in the command register 11, to execute a read operation, a write operation, an erase operation, etc.

The driver module 14 generates voltages used in the read operation, write operation, erase operation, etc. Also, the driver module 14 applies a generated voltage to the signal line corresponding to a selected word line and a select gate line, for example, based on a page address PAd stored in the address register 12.

The row decoder module 15 selects one of blocks BLK in the corresponding memory cell array 10, based on the block address BAd stored in the address register 12. Also, the row decoder module 15 transfers, for example, a voltage applied to the signal line corresponding to the selected word line to the selected word line of the selected block BLK.

The sense amplifier module 16 applies a desired voltage to each bit line in accordance with write data DAT received from the memory controller 2 in the write operation. Further, in the read operation, the sense amplifier module 16 determines what data is stored in the memory cell, based on the voltage of the bit line, and transfers a determination result to the memory controller 2 as read data DAT.

The semiconductor memory device 1 and memory controller 2 described above may constitute one semiconductor device by combining them together. Examples of such a semiconductor device include a memory card such as an SD™ card and an SSD (solid state drive).

1.1.2 Planar Layout

Next, a planar layout of the semiconductor memory device according to the embodiment will be described.

In the drawings referred to below, an X axis corresponds to the direction in which the bit lines BL extend, a Y axis corresponds to the direction in which the word lines WL extend, and a Z axis corresponds to the direction that is vertical to the surface of a semiconductor substrate on which the semiconductor memory device 1 is formed.

FIG. 2 is a plan view for illustrating the planar layout of the semiconductor memory device according to the embodiment. As shown in FIG. 2, the sense amplifier module 16 extends along the Y-axis on the semiconductor substrate and includes a plurality of sense amplifiers SA arranged side by side along the Y-axis. Each of the plurality of sense amplifiers SA is coupled to a corresponding set including bit lines BL and /BL.

The memory cell array 10 is divided into two regions sandwiching the sense amplifier module 16 along the X-axis. The bit lines BL extend above one of the two regions of the memory cell array 10 along the X axis, and the bit lines /BL extend above the other of the two regions of the memory cell array 10 along the X axis.

Of the two regions of the memory cell array 10, the region below the bit lines BL includes a dummy block dBLK, a block BLK0, a block BLK1, . . . , a BLKn, which are arranged in this order along the X axis in a direction away from the sense amplifier module 16. Of the two regions of the memory cell array 10, the region below the bit lines /BL includes a dummy block /dBLK, a block /BLK0, a block /BLK1, . . . , and a blocks /BLKn, which are arranged in this order along the X-axis in a direction away from the sense amplifier module 16.

In addition, the memory cell array 10 is provided with a cell area CA and a hookup area HA arranged along the Y-axis. The cell area CA is an area in which memory cells are provided, and the hookup area HA is an area for electrically coupling the row decoder module 15 and the cell area CA.

The row decoder module 15 is located at the first end of the memory cell array 10 and sense amplifier module 16, as viewed along the Y axis, and extends along the X-axis. The peripheral circuit PERI is located at the second end of the memory cell array 10 and sense amplifier module 16, as viewed along the Y-axis, and extends along the X-axis. The peripheral circuit PERI, the cell area CA of the memory cell array 10, hookup area HA of the memory cell array 10, and the row decoder module 15 are arranged in this order along the Y-axis.

1.1.3 Circuit Configuration of Memory Cell Array

Figure 3:
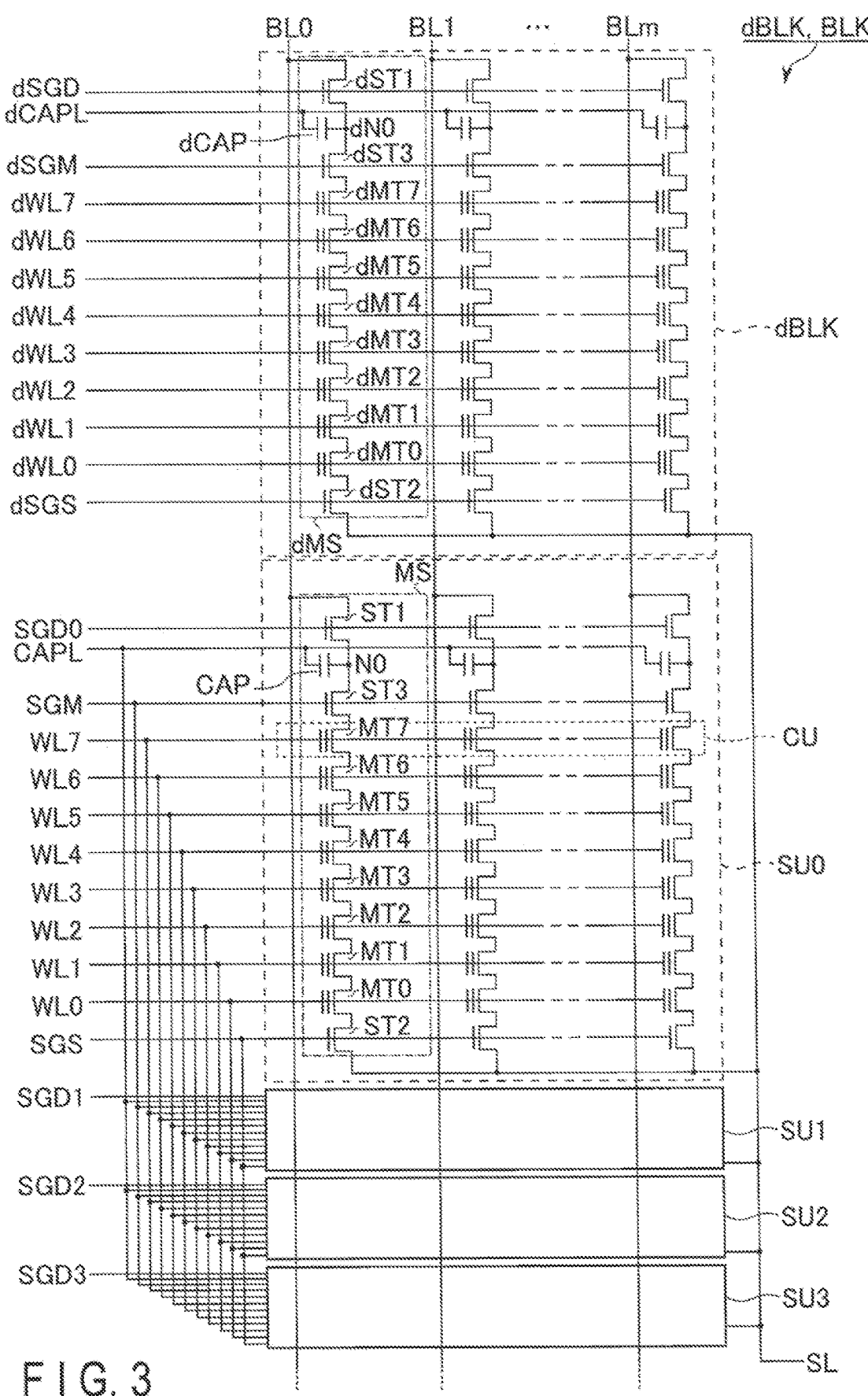
FIG. 3 is a circuit diagram for illustrating a configuration of a memory cell array of the semiconductor memory device according to the embodiment.

FIG. 3 is a circuit diagram for illustrating the configuration of the memory cell array of the semiconductor memory device according to the embodiment. FIG. 3 shows one block BLK and one dummy block dBLK, which are included among a plurality of blocks BLK of the memory cell array 10. It should be noted that the configurations of the blocks /BLK and dummy block /dBLK are similar to the configuration of the blocks BLK and dummy block dBLK, respectively, so that a description thereof will be omitted.

First, the configuration of the block BLK will be described.

As shown in FIG. 3, the block BLK includes, for example, four string units SU0-SU3. Each string unit SU includes a plurality of memory strings MS respectively associated with bit lines BL0, BL1, . . . , BLm (m is an integer of 1 or more).

Each memory string MS includes, for example, memory cell transistors MT0-MT7, selection transistors ST1-ST3 and a capacitor CAP. The memory cell transistor MT includes a control gate and a charge storage film, and functions as a NAND memory cell that stores data in a non-volatile manner. The capacitor CAP has a pair of electrodes including an electrode electrically coupled to the memory string MS, and functions as a DRAM memory cell that stores data in a volatile manner. During the operations, the selection transistors ST1 to ST3 are used for selecting a string unit SU and for selecting a memory cell transistor MT and a capacitor CAP of the selected string unit.

In each memory string MS, the memory cell transistors MT0-MT7 are coupled in series. A first end of the selection transistor ST1 is coupled to the associated bit line BL, and a second end of the selection transistor ST1 is coupled, via a node N0, to the electrode at the first end of the capacitor CAP and to the first end of the selection transistor ST3. The electrode at the second end of the capacitor CAP is coupled to a wiring CAPL. A second end of the selection transistor ST3 is coupled to a first end of the memory cell transistors MT0 to MT7 coupled in series. A first end of the selection transistor ST2 is coupled to a second end of the memory cell transistors MT0 to MT7 coupled in series. A second end of the selection transistor ST2 is coupled to the source line SL. The wiring CAPL and the source line SL are configured such that their potentials can be controlled to a predetermined voltage (e.g., a ground voltage) when they are coupled to a driver (not shown).

In the same block BLK, the control gates of the memory cell transistors MT0 to MT7 are commonly coupled to the word lines WL0 to WL7, respectively. The gates of the selection transistors ST1 in the string units SU0 to SU3 are commonly coupled to the select gate lines SGD0 to SGD3, respectively. The gates of the selection transistors ST2 are commonly coupled to the select gate line SGS. The gates of the selection transistors ST3 are commonly coupled to the select gate line SGM.

A set including the memory cell transistors MT coupled to a common word line WL in one string unit SU are referred to, for example, as a cell unit CU. For example, the storage capacity of the cell unit CU including memory cell transistors MT each storing 1-bit data is defined as "1 page data".

Next, the configuration of the dummy block dBLK will be described with reference to FIG. 3.

The configuration of the dummy block dBLK is similar to the configuration of one string unit SU within the block BLK. The dummy block dBLK includes a plurality of dummy memory strings dMS respectively associated with the bit lines BL0-BLm.

Each dummy memory string dMS includes, for example, dummy memory cell transistors dMT0-dMT7, dummy selection transistors dST1-dST3 and a dummy capacitor dCAP. The configurations of the dummy memory cell transistors dMT, the dummy capacitor dCAP and the dummy selection transistors dST1-dST3 are similar to those of the memory cell transistors MT, the capacitor CAP and the selection transistors ST1-ST3, respectively. The dummy capacitor dCAP functions as a reference cell used for determining the amount of charge stored in a read target capacitor CAP during a read operation.

In each dummy memory string dMS, the dummy memory cell transistors dMT0-dMT7 are coupled in series. A first end of the dummy selection transistor dST1 is coupled to the associated bit line BL, and a second end of the dummy selection transistor dST1 is coupled, via a node dN0, to the electrode at the first end of the dummy capacitor dCAP and the first end of the dummy selection transistor dST3. The electrode at the second end of the dummy capacitor dCAP is coupled to a wiring dCAPL. A second end of the dummy selection transistor dST3 is coupled to a first end of the dummy memory cell transistors dMT0 to dMT7 coupled in series. A first end of the dummy selection transistor dST2 is coupled to a second end of the dummy memory cell transistors dMT0 to dMT7 coupled in series. A second end of the dummy selection transistor dST2 is coupled to the source line SL. The wiring dCAPL and the source line SL are configured such that their potentials can be controlled to a predetermined voltage (e.g., a ground voltage) when they are coupled to a driver (not shown).

In the same dummy block dBLK, the control gates of the dummy memory cell transistors dMT0 to dMT7 are commonly coupled to the dummy word lines dWL0 to dWL7, respectively. The gates of the plurality of dummy selection transistors dST1 to dST3 in the dummy block dBLK are commonly coupled to the dummy select gate lines dSGD, dSGS and dSGM, respectively.

In the circuit configuration of the memory cell array 10 described above, the bit line BL is shared by the memory string MS and dummy memory string dMS to which the same column address is assigned in each string unit SU. The source line SL is shared, for example, by a plurality of blocks BLK and a dummy block dBLK.

The circuit configuration of the memory cell array 10 included in the semiconductor memory device 1 according to the present embodiment is not limited to the configuration described above. For example, the number of memory cell transistors MT and the number of selection transistors ST included in each memory string MS can be designed to any numbers. The number of string units SU included in each block BLK can be designed to be any number.

Next, data stored in the memory cell transistor MT and the capacitor CAP will be described, with reference to FIG. 4. As shown in FIG. 4, in the present embodiment, each of the memory cell transistor MT and the capacitor CAP is configured to store 1 bit.

First, the relationship between the data stored in the memory cell transistor MT and a threshold voltage will be described with reference to FIG. 4A.

As shown in FIG. 4A, the memory cell transistor MT has a threshold voltage that varies in accordance with the amount of charge accumulated in a charge storage film. Therefore, data stored in the memory cell transistor MT is determined according to the threshold voltage. Specifically, where the threshold voltage of the memory cell transistor MT is equal to a voltage VCGR or higher, it is determined that data "0" is stored in the memory cell transistor MT. On the other hand, where the threshold voltage is lower than the voltage VCGR, it is determined that data "1" is stored in the memory cell transistor MT. The voltage VCGR is a voltage used during a read operation and is referred to as a read voltage VCGR as well.

Next, the relationship between the data stored in the capacitor CAP and the voltage of the node N0 will be described with reference to FIG. 4B.

As shown in FIG. 4B, the data stored in the capacitor CAP is determined according to the amount of charge (voltage) charged between the pair of electrodes. Specifically, where the voltage charged in the capacitor CAP (that is, the voltage of the node N0 determined with respect to the voltage of the wiring CAPL) is equal to the voltage VDD/2, which is the half the power supply voltage VDD, or higher than the voltage VDD/2, then it is determined that data "1" is stored in the capacitor CAP. On the other hand, where the voltage of the node N0 determined with respect to the voltage of the wiring CAPL is lower than the voltage VDD/2, it is determined that data "0" is stored in the capacitor CAP.

1.1.4. Structure of Memory Cell Array

Next, an example of the structure of the memory cell array included in the semiconductor memory device according to the embodiment will be described.

In the plan views referred to below, hatching is added where appropriate to make the views easy to understand. The hatching added to the plan views is not necessarily related to the materials or characteristics of the hatched components. In the cross-sectional views, such components as an insulating layer (an interlayer insulating film), a wiring and a contact are omitted where appropriate to make the views easy to understand.

1.1.4.1 Cell Area

FIG. 5 is a plan view for illustrating how a structure of the cell area of the memory cell array is in the semiconductor memory device according to the embodiment, and the plan view corresponds to region V shown in FIG. 2. By way of example, FIG. 5 shows part of an area including the string units SU0 to SU3 of the block BLK0 of the cell area CA and a structure corresponding to the dummy block dBLK. Although illustration is omitted in FIG. 5, the block /BLK and the dummy block /dBLK have similar configurations to those of the block BLK and the dummy block dBLK, so that a description thereof will be omitted.

As shown in FIG. 5, the cell area CA includes, for example, slits SLT and SHE, memory pillars MP, contacts CP and LI, bit lines BL and a wiring layer stack.

The plurality of slits SLT each extend along the Y-axis and are arranged along the X-axis. The plurality of slits SHE each extend along the Y-axis and are arranged along the X-axis between adjacent slits SLT. For example, the width of the slit SLT is greater than the width of the slit SHE. Each of the slits SLT and SHE includes an insulator. In the adjacent two blocks BLK, the slit SLT divides the wiring layers corresponding to the word lines WL and the wiring layers corresponding to the select gate lines SGD. In addition, between the block BLK0 and its adjacent dummy block dBLK, the slit SLT divides the wiring layers corresponding to the word lines WL and the wiring layers corresponding to the select gate lines SGD from the wiring layers corresponding to the dummy word lines dWL and the wiring layers corresponding to the dummy select gate lines dSGD. Between the adjacent string units SU, the slit SHE divides the wiring layers corresponding to the select gate lines SGD.

A region partitioned by the slits SLT and SHE corresponds to one string unit SU or one dummy block dBLK. Between the slits SLT adjacent along the X axis, the string units SU0 to SU3 are provided. The four regions partitioned by the three slits SHE arranged between the slits SLT correspond to the string units SU0 to SU3, respectively.

Inside the slit SLT, a contact LI is provided that is insulated from the wiring layers corresponding to the select gate lines SGD and the word lines WL. A conductive path formed in the memory pillar MP is electrically coupled to the source line SL via the contact LI.

In the region between the adjacent slits SLT, a plurality of pillars are arranged in a staggered pattern such that they form, for example, 11 columns arranged along the X-axis. Three columns of pillars are provided below the respective three slits SHE. The remaining eight columns of pillars of the 11 columns of pillars are provided such that two columns are arranged in each of the four string units between the slits SLT and SHE, and the two columns of pillars function as memory pillars MP in each string unit SU. In the memory cell array 10, the layout corresponding to one block BLK and shown in FIG. 5 is repeatedly arranged along the X-axis by (n+1) times.

In the region between the slit SLT and the sense amplifier module 16, a plurality of pillars are arranged in a staggered pattern such that they form two columns arranged along the X-axis. The two columns of pillars function as memory pillars MP in the dummy block dBLK.

The plurality of bit lines BL each extend along the X-axis and are arranged along the Y-axis. In each dummy block dBLK and each string unit SU, one bit line BL is arranged such that it overlaps one memory pillar MP in plan view. In each dummy block dBLK and each string unit SU, the bit lines BL is coupled to the memory pillar MP via the contact CP. A conductive path formed in each memory pillar MP is electrically coupled to the corresponding bit line BL via a contact CP.

It should be noted that the planar layout of the memory cell array 10 described above is merely an example, and the planar layout is not limited thereto. For example, the number of slits SHE arranged between the adjacent slits SLT can be designed to be any number. The number of string units SU arranged between the adjacent slits SLT is changed based on the number of slits SHE to be provided. The number of memory pillars MP and the arrangement thereof may be designed to be any number and arrangement. The number of bit lines BL overlapping each memory pillar MP can be designed to be any number.

FIG. 6 is a cross-sectional view taken along line VI-VI in FIG. 5 and shows an example of a cross-sectional structure of the memory cell array 10 in the cell area CA. As shown in FIG. 6, the memory cell array 10 includes conductive layers 21-27 provided above the semiconductor substrate 20.

Specifically, a conductive layer 21 is provided above the semiconductor substrate 20, with an insulating layer (not shown) interposed therebetween. The conductive layer 21 is used as a select gate line SGS.

A plurality of layers (eight layers in the example shown in FIG. 6), each made up of an insulating layer (not shown) and a conductive layers 22, are alternately stacked above the conductive layer 21. For example, the plurality of conductive layers 22 are respectively used as word lines WL0 to WL7 in the order from the side of the semiconductor substrate 20.

A conductive layer 23 is provided above the uppermost conductive layer 22, with an insulating layer (not shown) interposed therebetween. For example, the conductive layer 23 is used as a select gate line SGM.

A plurality of layers (three layers in the example shown in FIG. 6), each made of an insulating layer (not shown) and a conductive layer 24, are alternately stacked above the conductive layer 23. For example, the plurality of conductive layers 24 are electrically coupled to each other and used as one wiring CAPL.

As viewed along the Z axis, the distance between the conductive layer 23 and the lowermost conductive layer 24 can be longer than the distance between the adjacent conductive layers 21 and 22, the distance between the two adjacent conductive layers 22, and the distance between the adjacent conductive layers 22 and 23.

A conductive layer 25 is provided above the uppermost conductive layer 24, with an insulating layer (not shown) interposed therebetween. The conductive layer 25 is used as a select gate line SGD.

The conductive layers 21 to 25 are formed, for example, as having plate shapes expanding along the XY plane and contain tungsten (W).

A conductive layer 27 is provided above the conductive layer 25, with an insulating layer (not shown) interposed therebetween. For example, the conductive layer 27 is used as a bit line BL. The conductive layer 27 contains copper (Cu), for example.

The memory pillar MP extends in the Z direction, passes through the conductive layers 21 to 25, and has its bottom located below the upper surface of the semiconductor substrate 20. The memory pillar MP includes a lower pillar LMP and an upper pillar UMP formed above the lower pillar LMP.

The lower pillar LMP includes, for example, a core film 30, a semiconductor film 31, a stacked film 32 and a semiconductor portion 33. Specifically, the core film 30 is provided substantially at the center of the lower pillar LMP and extends along the Z-axis. The upper end of the core film 30 is located, for example, at a position above the conductive layer 23 and below the lowermost conductive layer 24, and the lower end thereof is located, for example, at a position below the conductive layer 21. The core film 30 contains an insulator such as silicon oxide ($SiO_2$).

The semiconductor film 31 contains, for example, polysilicon and covers the bottom and side faces of the core film 30. The lower end of the semiconductor film 31 is in contact with the semiconductor substrate 20, and the upper end of the semiconductor film 31 is located at a position above the conductive layer 23 and below the lowermost conductive layer 24. The semiconductor film 31 includes a cylindrical portion that surrounds the side face of the core film 30.

The stacked film 32 covers the side face of the semiconductor film 31. The detailed configuration of the stacked film 32 will be described later.

The semiconductor portion 33 covers the upper surface of the core film 30 and is in contact with that portion of the semiconductor film 31 which is located above the core film 30. The semiconductor portion 33 has a columnar shape reaching the upper end of the lower pillar LMP. The semiconductor portion 33 electrically couples the lower pillar LMP and the upper pillar UMP to each other, and contains $n^+$ type impurities, such as arsenic (As) or phosphorus (P), to suppress an increase in the resistance value.

The upper pillar UMP includes, for example, a core film 40, a semiconductor film 41, an insulating film 42, a conductive film 43, an insulating film 44 and a semiconductor portion 45. Specifically, the core film 40 is provided substantially at the center of the upper pillar UMP and extends along the Z-axis. The upper end of the core film 40 is located, for example, at a position above the conductive layer 25, and the lower end thereof is located, for example, at a position below the lowermost conductive layer 24. The core film 40 contains an insulator such as silicon oxide ($SiO_2$).

The semiconductor film 41 contains, for example, polysilicon and covers the bottom and side faces of the core film 40. The lower end of the semiconductor film 41 is in contact with the semiconductor portion 33 of the lower pillar LMP, and the upper end of the semiconductor film 41 is located at a position above the conductive layer 25. The semiconductor film 41 includes a cylindrical portion that surrounds the side face of the core film 40.

The insulating film 42 contains a material having a dielectric constant higher than that of the stacked film 32 and the insulating film 44 (e.g., a high-κ material such as ZrTiOx), and covers part of the side face of the semiconductor film 41. The upper end of the insulating film 42 is located at a position between the uppermost conductive layer 24 and the conductive layer 25, and the lower end of the insulating film 42 is located at a position between the lowermost conductive layer 24 and the lower end of the semiconductor film 41.

The conductive film 43 contains a metal material and covers the side face of the insulating film 42. The upper end of the conductive film 43 is located at a position between the uppermost conductive layer 24 and the conductive layer 25, and the lower end of the conductive film 43 is located at a position between the lowermost conductive layer 24 and the upper end of the lower pillar LMP. That is, the conductive film 43 electrically couples the plurality of conductive layers 24 to each other.

The insulating film 44 contains an oxide of silicon nitride (SiN) and has a cylindrical shape between the conductive layer 25 and the semiconductor film 41. The insulating film 44 is provided together with the conductive layer 25 between interlayer insulating films (not shown) that sandwich the conductive layer 25 along the Z-axis. Therefore, the upper and lower ends of the insulating film 44 are aligned with the upper and lower ends of the conductive layer 25, respectively.

The semiconductor portion 45 covers the upper surface of the core film 40 and is in contact with that portion of the semiconductor film 41 which is located above the core film 40. The semiconductor portion 45 is, for example, cylindrical and reaches the upper end of the upper pillar UMP.

A conductive layer 26 functioning as a columnar contact CP is provided on the upper surface of the semiconductor film 41 of the memory pillar MP and the upper surface of the semiconductor portion 45. The conductive layer 26 contains, for example, tungsten (W). The upper surface of the conductive layer 26 is in contact with a corresponding one of conductive layers 27 (bit lines BL) and is electrically coupled thereto.

An insulating layer 50 is formed as having a plate shape expanding along the YZ plane, for example, and functions as a slit SLT that divides the conductive layers 21 to 25 along the X axis. The insulating layer 50 divides the conductive layers 21 to 25, for example, between two adjacent blocks BLK or between one block BLK and its adjacent dummy block dBLK. The upper end of the insulating layer 50 is located at a position between the conductive layers 25 and 27, and the lower end of the insulating layer 50 is located, for example, at a position below the upper surface of the semiconductor substrate 20. The insulating layer 50 includes an insulator such as silicon oxide ($SiO_2$).

The conductive layer 51 is formed as having a plate shape expanding, for example, along the YZ plane between the insulating layer 50 and the conductive layers 21 to 25, and functions as a contact LI that couples the semiconductor substrate 20 and a source line SL (not shown) to each other. The conductive layer 51 contains, for example polysilicon.

The insulating layer 52 is formed as having a plate shape expanding, for example, along the YZ plane, and functions as a slit SHE that divides the conductive layer 25 along the X axis. The insulating layer 52 divides the conductive layer 25, for example, between the two adjacent string units SU. The upper end of the insulating layer 52 is located at a position between the conductive layers 25 and 27, and the lower end of the insulating layer 52 is located, for example, at a position between the conductive layer 25 and the uppermost conductive layer 24. The insulating layer 52 contains an insulator such as silicon oxide ($SiO_2$).

Next, a cross-sectional structure along the XY plane of the memory pillar MP will be described with reference to FIGS. 7, 8 and 9.

FIG. 7 is a cross-sectional view taken along line VII-VII in FIG. 6, and shows an example of a cross-sectional structure of that portion of the lower pillar LMP which intersects the conductive layer 22.

As shown in FIG. 7, a core film 30 is provided in the central portion of the lower pillar LMP, a semiconductor film 31 surrounds the side face of the core film 30, and a stacked film 32 surrounds the side face of the semiconductor film 31. The stacked film 32 includes, for example, a tunnel insulating film 32a, a charge storage film 32b and a block insulating film 32c.

The tunnel insulating film 32a surrounds the side face of the semiconductor film 31, the charge storage film 32b surrounds the side face of the tunnel insulating film 32a, and the block insulating film 32c surrounds the side face of the charge storage film 32b. The conductive layer 22 surrounds the side face of the block insulating film 32c. Each of the tunnel insulating film 32a and the block insulating film 32c contains, for example, silicon oxide ($SiO_2$), and the charge storage film 32b contains, for example, silicon nitride (SiN).

With the above configuration, that portion of the lower pillar LMP which intersects the conductive layer 22 can function as a memory cell transistor MT. Similarly, those portions of the lower pillar LMP which intersect the conductive layers 21 and 23 can function as selection transistors ST2 and ST3, respectively. That is, in the lower pillar LMP, the semiconductor film 31 is used as current paths (channels) of the memory cell transistor MT and the selection transistors ST2 and ST3.

Figure 8:
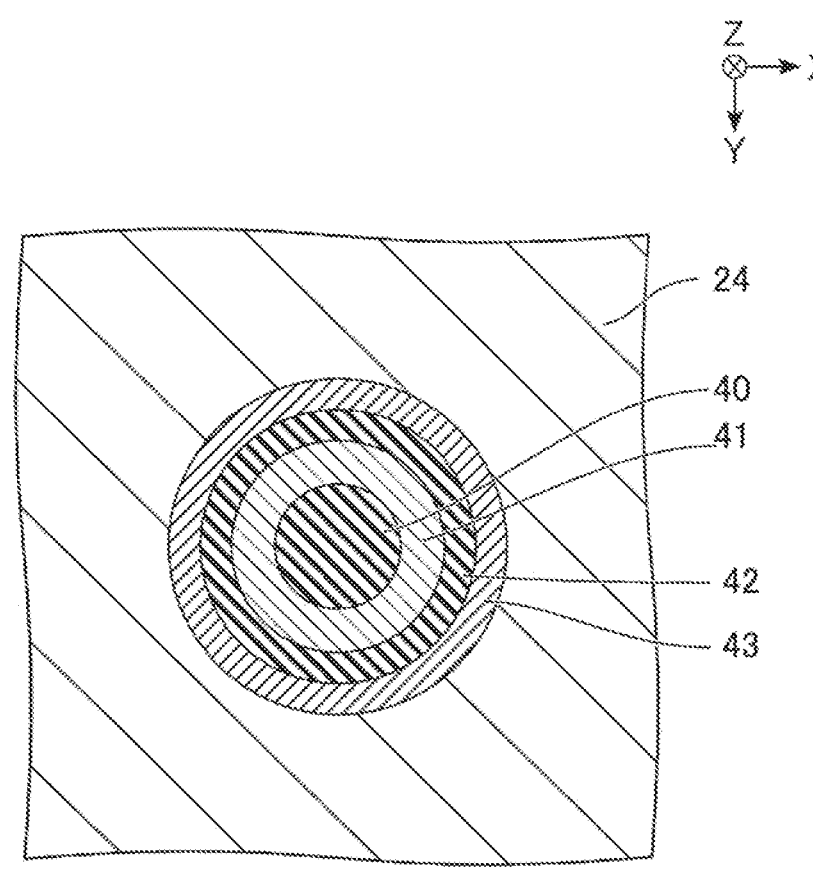
FIG. 8 is a cross-sectional view of the capacitor taken along line VIII-VIII shown in FIG. 6.

FIG. 8 is a cross-sectional view taken along line VIII-VIII in FIG. 6, and shows an example of a cross-sectional structure of that portion of the upper pillar UMP which intersects the conductive layer 24.

As shown in FIG. 8, a core film 40 is provided in the central portion of the upper pillar UMP, a semiconductor film 41 surrounds the side face of the core film 40, an insulating film 42 surrounds the side face of the semiconductor film 41, and a conductive film 43 surrounds the side face of the insulating film 42. The conductive layer 24 surrounds the side face of the conductive film 43.

With the above configuration, that portion of the upper pillar UMP which intersects the conductive layers 24 can function as a capacitor CAP. That is, that portion of the semiconductor film 41 which intersects the conductive layers 24 is used as one (node N0) of the pair of electrodes of the capacitor CAP. The conductive film 43 and the plurality of conductive layers 24 are used as the other electrode (wiring CAPL) of the pair of electrodes of the capacitor CAP. Thus, the area of the electrodes of the capacitor can be increased as compared with the case where the capacitor is formed as a one-layer conductive layer 24. In addition, by using a high-K material for the insulating film 42, the dielectric constant between the electrodes can be increased. Therefore, the capacitor CAP can be designed to have a capacity large enough to be used as a DRAM.

Figure 9:
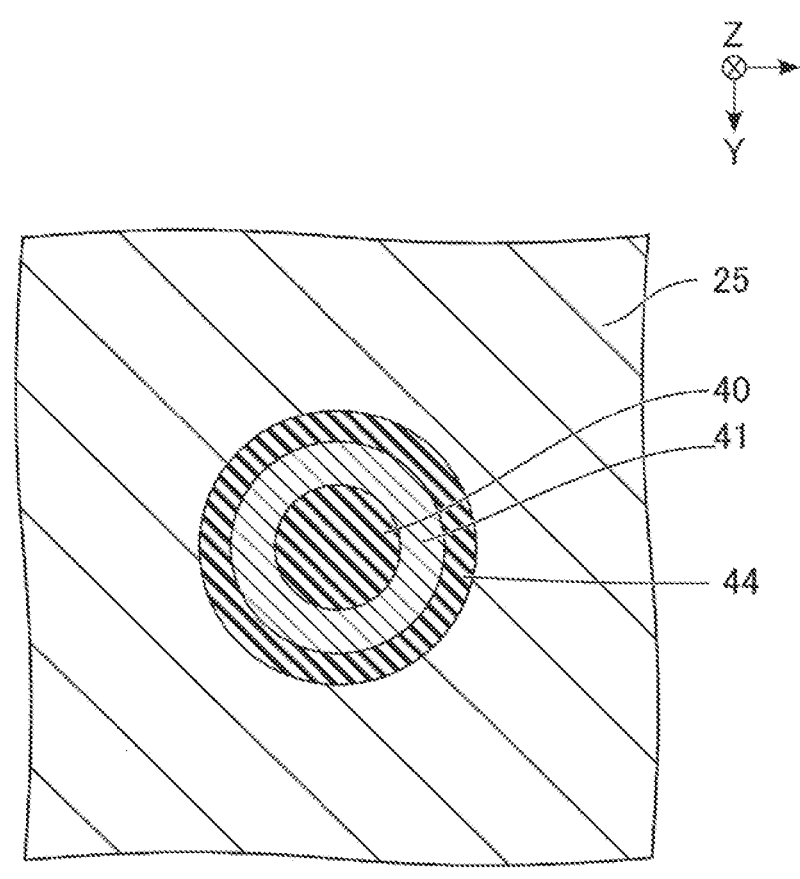
FIG. 9 is a cross-sectional view of a selection transistor taken along line IX-IX shown in FIG. 6.

FIG. 9 is a cross-sectional view taken along line IX-IX in FIG. 6 and shows an example of a cross-sectional structure of that portion of the upper pillar UMP which intersects the conductive layer 25.

As shown in FIG. 9, a core film 40 is provided in the central portion of the upper pillar UMP, a semiconductor film 41 surrounds the side face of the core film 40, an insulating film 42 surrounds the side face of the semiconductor film 41, and an insulating film 44 surrounds the side face of the semiconductor film 41. The conductive layer 25 surrounds the side face of the insulating film 44.

With the above configuration, that portion of the upper pillar UMP which intersects the conductive layer 25 can function as a selection transistor ST1. That is, that portion of the semiconductor film 41 which intersects the conductive layer 25 is used as a current path of the selection transistor ST1 (that is, a current path between the bit line BL and the lower pillar LMP).

1.1.4.2 Hookup Area

Figure 10:
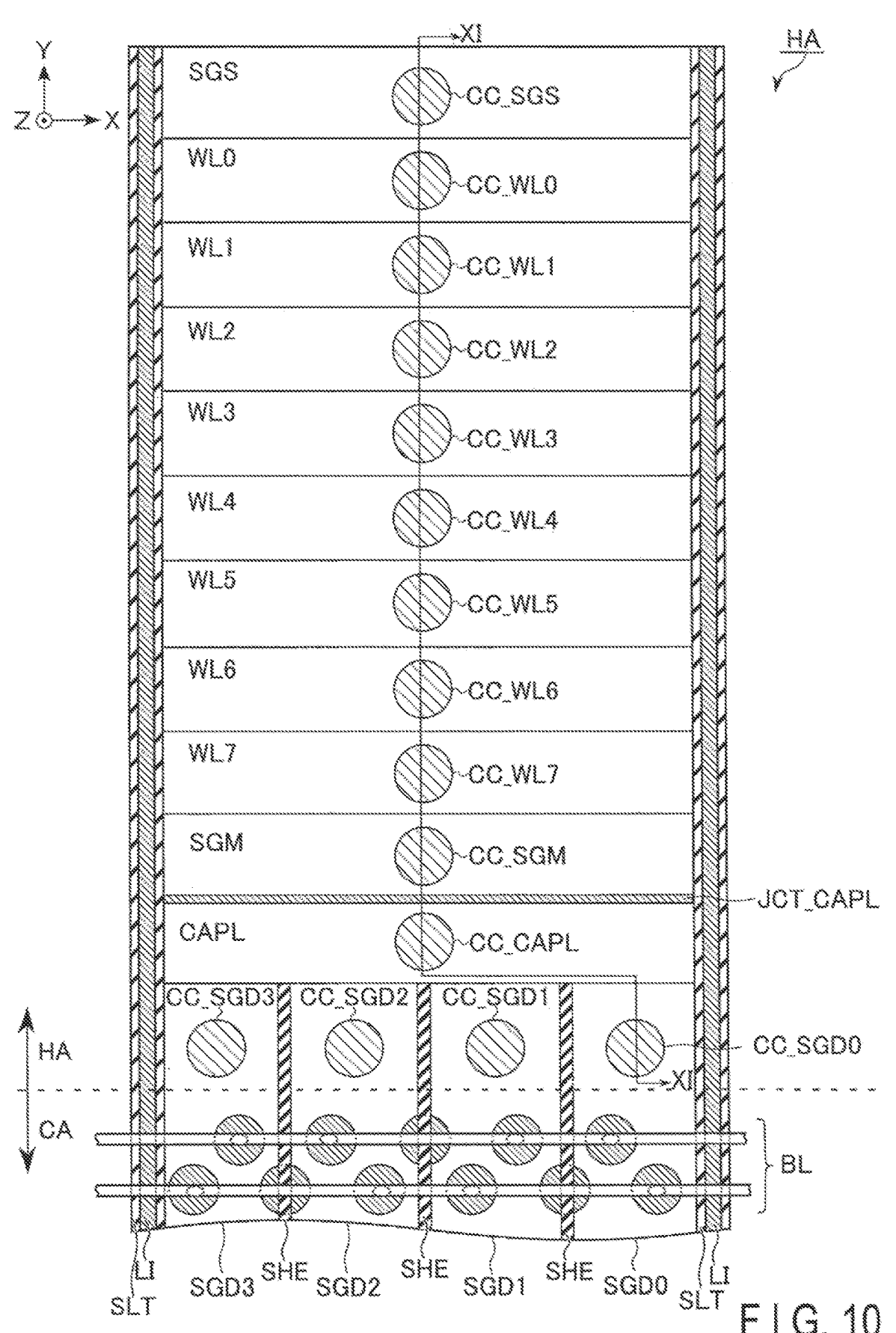
FIG. 10 is a plan view of a hookup area of region X shown in FIG. 2.

FIG. 10 is a plan view for illustrating a structure of the hookup area of the memory cell array in the semiconductor memory device according to the embodiment, and the plan view corresponds to region X shown in FIG. 2. By way of example, FIG. 10 shows part of an area including a structure corresponding to the block BLK0 of the hookup area HA. Although illustration is omitted in FIG. 10, the block /BLK and the dummy blocks dBLK and /dBLK have a similar configuration to the configuration of the block BLK, so that a description thereof will be omitted.

As shown in FIG. 10, the hookup area HA includes, for example, slits SLT and SHE, contacts LI and CC and a wiring layer stack.

The wiring layers SGD, CAPL, SGM, WL7 to WL0 and SGS forming the wiring layer stack are provided stepwise in the order mentioned along the Y-axis in the direction away from the cell area CA. That is, in plan view, the lower the wiring layers SGD, CAPL, SGM, WL7 to WL0 and SGS are located, the longer they are along the Y-axis, and the wiring layers SGD, CAPL, SGM, WL7 to WL0 and SGS have terrace regions that do not overlap the upper wiring layers.

A contact CC is provided in each of the terrace regions corresponding to the wiring layers. Specifically, in plan view, contacts CC_SGD0 to CC_SGD3 are provided in the terrace regions of the select gate lines SGD0 to SGD3, respectively. A contact CC_CAPL is provided in the terrace region of the wiring CAPL. A contact CC_SGM is provided in the terrace region of the select gate line SGM. Contacts CC_WL7 to CC_WL0 are provided in the terrace regions of the word lines WL7 to WL0, respectively. A contact CC_SGS is provided in the terrace region of the select gate line SGS.

As described above, the wiring CAPL is made of a plurality of conductive layers 24. Since the plurality of conductive layers 24 have the same length along the Y axis, their ends align along the Y axis. In addition, a structure JCT_CAPL that electrically couples the plurality of conductive layers 24 is provided at the end of the plurality of conductive layers 24 as viewed along the Y-axis.

It should be noted the planar layout of the hookup area HA described above is merely an example, and the planar layout is not limited thereto. For example, the number of steps of the staircase of the wiring layers can be arbitrarily designed, and steps along the X axis may be provided in addition to steps along the Y axis. In the hookup area HA, not only the contacts CC but also columnar structures penetrating the staircase-like wiring layers along the Z-axis may be provided. Each columnar structure has, for example, a structure similar to that of the memory pillar MP, and has a function of supporting the staircase-like structure during the manufacturing process, described later, of the memory cell array 10.

FIG. 11 is a cross-sectional view taken along line XI-XI in FIG. 10, and shows an example of a cross-sectional structure of the memory cell array 10 in the hookup area HA. As shown in FIG. 11, the conductive layers 21-25 extend along the Y-axis and reach the hookup area HA.

In the hookup area HA, a conductive film 61 functioning as the contact CC_SGS is provided on the upper surface of the conductive layer 21. A plurality of conductive films 62 functioning as CC_WL0 to CC_WL7 in the order from the lowermost layer are provided on the upper surfaces of the plurality of conductive layers 22. A conductive film 63 functioning as the contact CC_SGM is provided on the upper surface of the conductive layer 23. A conductive film 64 functioning as the contact CC_CAPL is provided on the upper surface of the uppermost conductive layer 24. The conductive film 64 is, for example, in contact with the upper surface of the upper conductive layer 24, and is electrically coupled to all the conductive layers 24 by the conductive film 66. A conductive film 65 functioning as the contact CC_SGD is provided on the upper surface of the conductive layer 25. The conductive films 61 to 65 contain, for example, tungsten (W) and have a columnar shape extending along the Z-axis.

A conductive film 66 functioning as the structure JCT-_CAPL is provided at the ends of the plurality of conductive layers 24. The conductive film 66 contains, for example, tungsten (W), has a plate-like shape expanding along the XZ plane, and is in contact with each of the plurality of conductive layers 24.

1.1.5 Sense Amplifier

Next, a configuration of the sense amplifier in the semiconductor memory device according to the embodiment will be described.

FIG. 12 is a circuit diagram showing the configuration of the sense amplifier in the semiconductor memory device according to the embodiment. FIG. 12 shows a circuit configuration of one sense amplifier SA that is coupled to a pair of bit lines BL and /BL in the sense amplifier module 16 shown in FIG. 2.

As shown in FIG. 12, the sense amplifier SA includes transistors Tr1, Tr2, Tr3, Tr4, Tr5, Tr6 and Tr7. The transistors Tr1, Tr3 and Tr5 are, for example, p-type MOS (Metal oxide semiconductor) transistors, and the transistors Tr2, Tr4, Tr6 and Tr7 are n-type MOS transistors.

The transistor Tr1 includes a first end coupled to a node N1, a second end coupled to a node N3, and a gate coupled to a node N2. The transistor Tr2 includes a first end coupled to the node N1, a second end coupled to a node N4, and a gate coupled to the node N2.

The transistor Tr3 includes a first end coupled to the node N2, a second end coupled to the node N3, and a gate coupled to the node N1. The transistor Tr4 includes a first end coupled to the node N2, a second end coupled to the node N4, and a gate coupled to the node N1.

The transistor Tr5 includes a first end to which power supply voltage VDD is applied, a second end coupled to the node N3, and a gate to which a signal ENn is supplied. The transistor Tr6 includes a first end coupled to the node N4, a second end to which a voltage VSS is applied, and a gate to which a signal EN is supplied. The signal ENn is an inverted signal of the signal EN. The voltage VSS is a ground voltage and is, for example, 0V.

The transistor Tr7 includes a first end coupled to the node N1, a second end coupled to the node N2, and a gate to which a signal EQ supplied.

A bit line BL is coupled to the sense amplifier SA configured as above via the node N1, and a bit line /BL is coupled via the node N2. Thus, a dummy memory string dMS and a plurality of memory strings MS are coupled in parallel to one sense amplifier SA via the bit lines BL, and a dummy memory string /dMS and a plurality of memory strings /MS are coupled in parallel via the bit lines /BL.

1.2 Operation

Next, the semiconductor memory device according to the embodiment will be described.

In the description set forth below, a memory cell transistor MT (NAND memory cell) and a capacitor CAP (DRAM memory cell) that are to be operated will be referred to as a selected memory cell transistor MT and a selected capacitor CAP, respectively. The memory cell transistors MT other than the selected memory cell transistor MT and the capacitors CAP other than the selected capacitor CAP will be referred to as non-selected memory cell transistors MT and non-selected capacitors CAP, respectively. A word line WL coupled to a selected memory cell transistor MT will be referred to as a selected word line WLsel, and the word lines WL other than the selected word line WLsel will be referred to as non-selected word lines WLusel. A string unit SU including both a selected memory cell transistor MT and a selected capacitor CAP will be referred to as a selected string unit SU, and the string units SU other than the selected string unit SU will be referred to as non-selected string units SU.

1.2.1 Read Operation

A read operation in the semiconductor memory device according to the embodiment will be described, with reference to the timing chart shown in FIG. 13. FIG. 13 shows a case where data is read from a selected memory cell transistor MT that is coupled to a set made up of a certain bit line BL and a selected word line WLsel.

First, an operation of transferring data from the selected memory cell transistor MT to a selected capacitor CAP will be described. In the read operation performed in the present embodiment, the data stored in the selected capacitor CAP is destroyed when the data is transferred from the selected memory cell transistor MT to the selected capacitor CAP.

As shown in FIG. 13, until time t1, a voltage VSS is applied to the bit lines BL and /BL, select gate lines SGD, SGM and SGS, wiring CAPL, contact LI and all word lines WL. A voltage VSS is applied to the channel of the memory string MS (selected memory string MS) including the selected memory cell transistor MT and the selected capacitor CAP.

At time t1, the operation of transferring the data stored in the selected memory cell transistor MT to the selected capacitor CAP is started. Specifically, the row decoder module 15 applies a voltage Vsg to the select gate lines SGS and SGM, and applies a voltage VDD to the source line SL via the contact LI. For example, the voltage Vsg is a voltage that turns on each of the selection transistors ST1 to ST3. Thus, the selection transistors ST2 and ST3 are turned on.

The row decoder module 15 applies a voltage VREAD to non-selected word lines WLusel while applying a voltage VCGR to a selected word line WLsel. The voltage VREAD is a voltage that turns on the memory cell transistor MT without reference to the threshold voltage of the memory cell transistor MT.

Where the threshold voltage of the selected memory cell transistor MT is lower than the voltage VCGR (that is, where data "1" is stored in the selected memory cell transistor MT), all memory cell transistors MT in the selected memory string MS are turned on. Therefore, the voltage VDD of the source line SL is transferred to the node N0 by way of the channels of the memory cell transistor MT and selection transistor ST3 in the selected memory string MS. Thus, the voltage of the node N0 becomes the voltage VDD/2 or higher, and data "1" of the selected memory cell transistor MT is transferred to the selected capacitor CAP.

On the other hand, where the threshold voltage of the selected memory cell transistor MT is equal to the voltage VCGR or higher (that is, where data "0" is stored in the selected memory cell transistor MT), the selected memory cell transistor MT is turned off. In the memory string MS, therefore, the voltage VDD of the source line SL is not transferred to the channels that are on the capacitor CAP side of the selected memory cell transistor MT. Thus, the voltage of the node N0 remains at the voltage VSS (lower than the voltage VDD/2), and as a result, the data "0" of the selected memory cell transistor MT is transferred to the selected capacitor CAP.

At time t2, the voltage VSS is applied to the bit lines BL and /BL, select gate lines SGD, SGM and SGS, wiring CAPL, contact LI and all word lines WL. Along with this, the voltage VSS is applied to the channel of the selected memory string MS. Thus, the period for transferring the data of the selected memory cell transistor MT to the selected capacitor CAP ends.

Next, a operation of reading data in the selected capacitor CAP to the sense amplifier module 16 will be described.

At time t3, the sense amplifier SA in the sense amplifier module 16 applies the voltage VDD/2 to corresponding bit lines BL and /BL. Specifically, for example, the sequencer 13 supplies an "L" level signal ENn, an "H" level signal EN and an "H" level signal EQ, thereby turning on the transistors Tr5 to Tr7 in the sense amplifier SA. Thus, the voltages of the bit lines BL and /BL are equalized and set at an intermediate voltage (=VDD/2) between the voltages VDD and VSS. Although not shown in FIG. 13, at time t3, the row decoder module 15 applies the voltage Vsg to the dummy select gate line /dSGD corresponding to a dummy block /dBLK. Thus, the dummy selection transistor /dST1 corresponding to the dummy block /dBLK is turned on, and a dummy capacitor /dCAP is charged to the voltage VDD/2.

At time t4, the row decoder module 15 continues to apply the voltage VSS to the select gate line SGD corresponding to the non-selected string unit SU while applying the voltage Vsg to the select gate line SGD corresponding to the selected string unit SU. Thus, the selection transistor ST1 corresponding to the selected string unit SU is turned on.

At time t5, the sequencer 13 supplies an "L" level signal EQ to turn off the transistor Tr7 in the sense amplifier SA. Thus, the voltages of the bit lines BL and /BL change based on the magnitude relationship between the amount of charge of the selected capacitor CAP and the amount of charge of the dummy capacitor /dCAP.

Where the voltage of the node N0 of the capacitor CAP is the voltage VDD/2 or higher (that is, where data "1" is stored in capacitor CAP), the voltage of the bit line BL rises slightly from the voltage VDD/2. The sense amplifier SA amplifies the voltage difference between the bit lines BL and /BL and applies voltages VDD and VSS to the bit lines BL and /BL, respectively. Thus, the sense amplifier module 16 senses that the voltage of the bit line BL is equal to the voltage VDD/2 or higher, and can read data "1" from the selected capacitor CAP.

On the other hand, where the voltage of the node N0 of the capacitor CAP is less than the voltage VDD/2 (that is, where data "0" is stored in the capacitor CAP), the voltage of the bit line BL drops slightly from the voltage VDD/2. The sense amplifier SA amplifies the voltage difference between the bit lines BL and /BL and applies voltages VSS and VDD to the bit lines BL and /BL, respectively. Thus, the sense amplifier module 16 can sense that the voltage of the bit line BL is less than the voltage VDD/2, and can read data "1" from the selected capacitor CAP.

At time t6, the row decoder module 15 applies the voltage VSS to the select gate line SGD corresponding to the selected string unit SU to turn off the selection transistor ST1.

At time t7, the sense amplifier module 16 applies the voltage VSS to the bit line BL.

By the operations described above, the read operation from the selected capacitor CAP is completed.

It should be noted that the charge charged in the capacitor CAP leaks over time. Therefore, where data "1" is stored in the capacitor CAP, the refresh operation is performed regularly to keep the voltage of the node N0 to be VDD/2 or higher. The refresh operation is similar to the read operation from the selected capacitor CAP described above (the operation performed from time t3 to time t7 in FIG. 13). Thus, the voltage of the node N0 storing data "1" can be kept at the voltage VDD/2 or higher.

1.2.2 Erase Operation

Next, an erase operation in the semiconductor memory device according to the embodiment will be described, with reference to the timing chart shown in FIG. 14. FIG. 14 shows a case where data is erased from a selected memory cell transistor MT that is coupled to a set made up of a certain bit line BL and a selected word line WLsel. It is assumed that data is stored in the selected capacitor CAP even during the erase operation.

As shown in FIG. 14, until time t11, the voltage VSS is applied to the bit lines BL and /BL, select gate lines SGD, SGM and SGS, wiring CAPL, contact LI and all word lines WL. Along with this, in the selected memory string MS, the voltage VSS is applied to the channels that are on the memory cell transistor MT side of the selected transistor ST. On the other hand, in the node N0, a voltage corresponding to the data stored in the selected capacitor CAP is charged (a voltage equal to the voltage VDD/2 or higher where data "1" is stored, or the voltage VSS where data "0" is stored).

At time t11, the row decoder module 15 applies a voltage VERA to the contact LI. The voltage VERA is a high voltage used to extract charge accumulated in the memory cell transistor MT. Also, the row decoder module 15 applies the voltages VSS and Va to the selected word line WLsel and the select gate line SGM, respectively, and sets the non-selected word lines WLusel and the select gate line SGS in the floating state. The voltage Va is a constant voltage for making the gate-source voltage of the selection transistor ST3 lower than the voltage VERA, and suppresses the extraction of the charge from the selection transistor ST3 during the erase operation. Thus, the gate-source voltage of the selected memory cell transistor MT selectively becomes the voltage VERA, and the data stored in the selected memory cell transistor MT is erased.

At time t17, the row decoder module 15 applies the voltage VSS to the contact LI, the select gate lines SGM and SGS and all word lines WL.

By the operations described above, the erase operation is completed.

It should be noted that the period required for the erase operation described above may be longer than the interval of the refresh operation periodically performed on the capacitor CAP. Therefore, the example of FIG. 14 shows a case where the refresh operation is performed during the period from time t12 to time t16, which is within the period from time t11 to time t17. The refresh operation performed from time t12 to time t16 is similar to the refresh operation performed from time t3 to time t7 described with reference to FIG. 13, so that a description thereof will be omitted. Thus, the voltage of the node N0 storing data "1" can be kept at the voltage VDD/2 or higher even during the execution of the erase operation.

1.2.3 Write Operation

Next, a write operation in the semiconductor memory device according to the embodiment will be described, with reference to the timing chart shown in FIG. 15. FIG. 15 shows a case where data is written to a selected memory cell transistor MT that is coupled to a set made up of a certain bit line BL and a selected word line WLsel.

First, the operation of writing data to the selected capacitor CAP via the bit line BL will be described.

As shown in FIG. 15, until time t21, the voltage VSS is applied to the bit lines BL and /BL, select gate lines SGD, SGM and SGS, wiring CAPL, contact LI and all word lines WL. Along with this, the voltage VSS is applied to the channel of the selected memory string MS.

At time t21, the sense amplifier module 16 applies the voltage VDD to the bit line BL coupled to a selected capacitor CAP to which data "1" is to be written, and applies the voltage VSS to the bit line BL coupled to a selected capacitor CAP to which data "0" is to be written.

The row decoder module 15 applies a voltage Vsg to the select gate line SGD corresponding to a selected string unit SU, and applies the voltage VSS to the select gate line SGD corresponding to non-selected string units SU. Thus, only the select gate line SGD corresponding to the selected string unit SU is turned on, and the voltage applied to the bit line BL is transferred to the node N0. That is, the voltage VDD is transferred to the node N0 of the selected capacitor CAP to which data "1" is to be written, and the voltage VSS is transferred to the node N0 of the selected capacitor CAP to which data "0" is to be written.

At time t22, the sense amplifier module 16 applies the voltage VSS to the bit line BL, and the row decoder module 15 applies the voltage VSS to the select gate line SGD.

By the operations described above, data is written to the selected capacitor CAP.

Next, the operation of transferring the data written in the selected capacitor CAP to the selected memory cell transistor MT will be described.

During the period from time t23 to time t28, the data stored in the selected capacitor CAP is refreshed. That is, at times t23, t24, t25, t27 and t28 shown in FIG. 15, operations similar to those performed at times t3, t4, t5, t6 and t7 in FIG. 13 are executed. Thus, the voltage of the node N0 of the selected capacitor CAP storing data "1" approaches the voltage VDD.

At time t26, which is between times t25 and t27 in which the voltage of node N0 is refreshed, the row decoder module 15 applies a voltage Vsg to a select gate line SGM, and applies voltages VPGM and VPASS to the selected word line WLsel and non-selected word lines WLusel, respectively. The voltage VPASS is a voltage that suppresses an increase in the threshold voltage of the memory cell transistor MT while turning on the memory cell transistor MT without reference to the threshold voltage of the memory cell transistor MT. The voltage VPGM is higher than the voltage VPASS and is a voltage that raises the threshold voltage of the memory cell transistor MT.

Thus, in the memory string MS to which the voltage VDD is applied to the node N0 (that is data "1" is stored in the selected capacitor CAP), the voltage VDD is transferred to the channels on the side of the memory cell transistor MT. Therefore, a voltage (VPGM-VDD) is applied to the selected memory cell transistor MT. Thus, the threshold voltage of the selected memory cell transistor MT does not rise, and as a result, data "1" is written to the selected memory cell transistor MT.

On the other hand, where the voltage VSS is applied to the node N0 (data "0" is stored in selected capacitor CAP), voltage VSS is transferred to the channels on the side of the memory cell transistor in the memory string MS. Therefore, a voltage (VPGM-VSS) is applied to the selected memory cell transistor MT. Thus, data "0" is written when the threshold voltage of the selected memory cell transistor MT rises.

Thereafter, at time t27, the row decoder module 15 applies the voltage VPASS to the selected word line WLsel and applies the voltage VSS to the select gate line SGD.

At time t29, which is after time t28, the row decoder module 15 applies the voltage Vsg to the select gate line SGS to turn on the selection transistor ST2. Thus, the channel and the source line SL are electrically coupled, and electrons in the channel are extracted to the side of the source line SL.

At time t30, the row decoder module 15 applies the voltage VSS to the select gate line SGS.

By the operations described above, the write operation is completed.

1.3 Manufacturing Method

Next, an example in which a series of manufacturing steps, from the formation of a layer stack on the semiconductor substrate 20 to the formation of the slits SHE, are performed for manufacturing the semiconductor memory device according to the embodiment will be described. FIGS. 16, 17, 19 to 22, 24, 25 and 31 show an example of a cross-sectional structure including a structure corresponding to the hookup area HA of the memory cell array 10 during the manufacturing process of the semiconductor memory device according to the embodiment. FIGS. 18, 23, 26 to 30 and 32 to 34 show an example of a cross-sectional structure including a structure corresponding to the cell area CA of the memory cell array 10 during the manufacturing process of the semiconductor memory device according to the embodiment.

First, as shown in FIG. 16, an insulating layer 71 and a sacrificial member 72 are stacked on the upper surface of the semiconductor substrate 20 such that they cover the cell area CA and the hookup area HA. A plurality of layers (eight layers in the example shown in FIG. 16), each made up of an insulating layer 71 and a sacrificial member 73, are alternately stacked on the upper surface of the sacrificial member 72. On the upper surface of the uppermost sacrificial member 73, an insulating layer 71 and a sacrificial member 74 are stacked. An insulating layer 71 is stacked on the upper surface of the sacrificial member 74. The insulating layers 71 contain, for example, silicon oxide ($SiO_2$), and the sacrificial members 72-74 contain, for example, silicon nitride (SiN).

Figure 17:
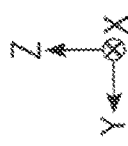
FIG. 17 is a cross-sectional view of the memory cell array for illustrating the manufacturing process of the semiconductor memory device according to the embodiment.
Figure 17:
Figure 17:
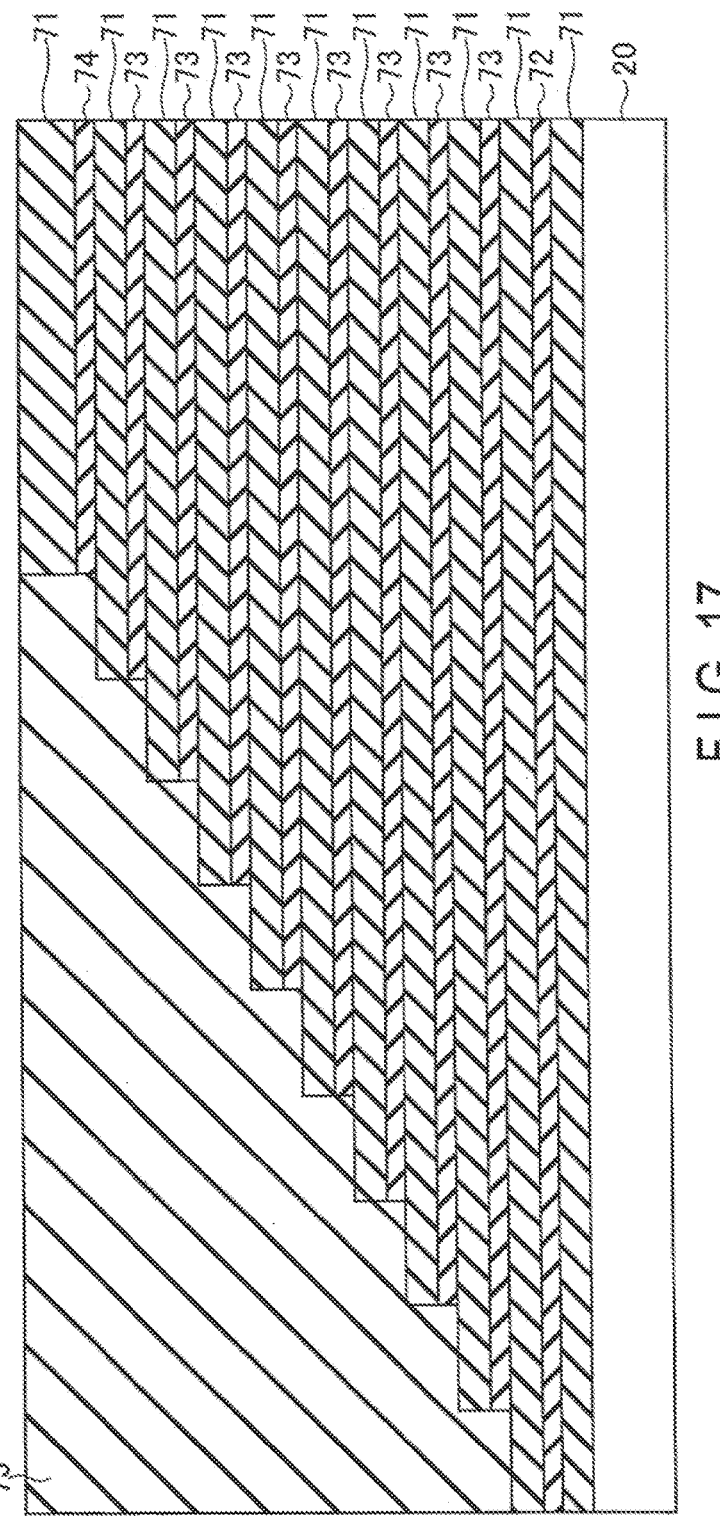

Next, as shown in FIG. 17, in the hookup area HA, a mask (not shown) is provided on the upper surface of the uppermost insulating layer 71, and a pattern is formed on the mask by lithography. Thereafter, based on the pattern, anisotropic etching is performed on the stacked structure made up of the sacrificial members 72 to 74 and the insulating layers 71, and a portion of the stacked structure is removed by slimming the mask pattern. This process is repeated a number of times. Thus, the portion of the stacked structure which corresponds to the hookup area HA can be etched such that it forms a staircase structure extending along the Y-axis. The anisotropic etching used in this step is, for example, RIE (Reactive ion etching). Thereafter, the staircase structure is embedded with an insulating layer 75 up to the position of the uppermost insulating layer 71. The insulating layer 75 contains, for example, silicon oxide ($SiO_2$).

Next, as shown in FIG. 18, a lower pillar LMP is formed in the cell area CA. Specifically, a hole is formed through the insulating layers 71 and the sacrificial members 72 to 74 to reach the semiconductor substrate 20, for example, by performing lithography and anisotropic etching. Subsequently, a block insulating film 32c, a charge storage film 32b and a tunnel insulating film 32a are sequentially formed in the hole to form a stacked film 32. After the stacked film 32 at the bottom of the hole is removed by anisotropic etching, a semiconductor film 31 and a core film 30 are sequentially formed to fill the hole. The anisotropic etching used in the present step is, for example, RIE. Thereafter, the core film 30 is removed from the upper end of the hole to a predetermined depth, and a semiconductor portion 33 is formed in the space from which the core film 30 is partially removed. The semiconductor portion 33 is doped, for example, with $n^+$ type impurities. Thus, the lower pillar LMP is formed.

Figure 19:
FIG. 19 is a cross-sectional view of the memory cell array for illustrating the manufacturing process of the semiconductor memory device according to the embodiment.

Next, as shown in FIG. 19, a plurality of layers (three layers in the example shown in FIG. 19), each made up of an insulating layer 76 and a sacrificial member 77, are alternately stacked on the upper surfaces of the insulating layers 71 and 75 such that they cover the cell area CA and the hookup area HA. On the upper surface of the uppermost sacrificial member 77, an insulating layer 76 is stacked. The insulating layers 76 contain, for example, silicon oxide ($SiO_2$), and the sacrificial members 77 contain, for example, silicon nitride (SiN).

Next, as shown in FIG. 20, in the hookup area HA, a mask (not shown) is provided on the upper surface of the uppermost insulating layer 76, and a pattern is formed on the mask by lithography. Thereafter, based on the pattern, anisotropic etching is performed on the stacked structure of the sacrificial members 77 and the insulating layers 76. Thus, part of the insulating layers 71 and the insulating layer 75 are exposed in the hookup area HA. Moreover, each of the plurality of sacrificial members 77 is exposed at a Y-axis end portion of the stacked structure made up of the sacrificial members 77 and the insulating layers 76. The anisotropic etching used in the present step is, for example, RIE.

Next, as shown in FIG. 21, a sacrificial member 78 is provided over the entire surface, and thereafter the sacrificial member 78 is patterned by lithography and anisotropic etching. Thus, the sacrificial member 78 is removed, except for the portion covering the Y-axis end portion of the stacked structure of the sacrificial members 77 and the insulating layers 76 (that is, the plate-like portion along the XZ plane). The sacrificial member 78 contains, for example, silicon nitride (SiN).

Figure 22:
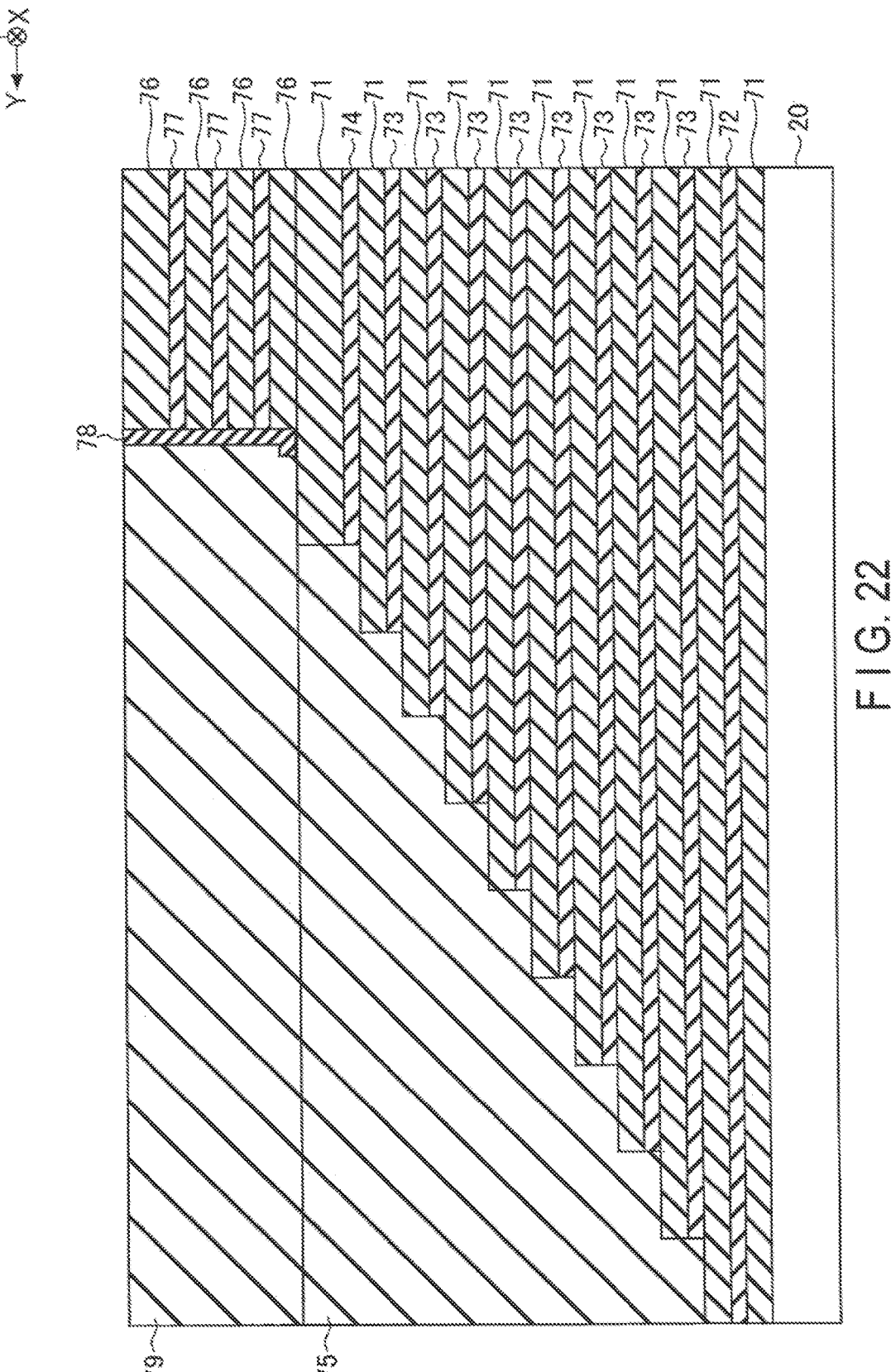
FIG. 22 is a cross-sectional view of the memory cell array for illustrating the manufacturing process of the semiconductor memory device according to the embodiment.

Next, as shown in FIG. 22, an insulating layer 79 is formed to bury the region from which the stacked structure, generated by performing the step shown in FIG. 20, made up of the sacrificial members 77 and the insulating layers 76 is removed. The insulating layer 79 contains, for example, silicon oxide ($SiO_2$). Those portions of the sacrificial member 78 and the insulating layer 79 which are located above the uppermost insulating layer 76 are removed, for example, by CMP (Chemical mechanical polishing).

Figure 23:
FIG. 23 is a cross-sectional view of the memory cell array for illustrating the manufacturing process of the semiconductor memory device according to the embodiment.
Figure 23:

Next, as shown in FIG. 23, part of the upper pillar UMP is formed in the cell area CA. Specifically, a hole is formed through the lowermost sacrificial members 77 to reach the lowermost insulating layer 76, for example, by performing lithography and anisotropic etching. It is desirable that the semiconductor portion 33 of the lower pillar LMP is not exposed in the bottom of the hole. Subsequently, a conductive film 43 is formed in the hole. After the conductive film 43 in the bottom of the hole is removed by anisotropic etching, an insulating film 42 is formed. Then, the insulating film 42 in the bottom of the hole is removed by anisotropic etching to expose the semiconductor portion 33 of the lower pillar LMP. The anisotropic etching used in the present step is, for example, RIE. Thereafter, a sacrificial member 80 is formed to fill the hole. The sacrificial member 80 contains, for example, amorphous silicon.

In connection with the above example, reference was made to a case where the semiconductor portion 33 is exposed at the timing when the insulating film 42 is partially removed, but this is not restrictive. The timing at which the semiconductor portion 33 is exposed can be freely determined as long as the conductive film 43 and the semiconductor portion 33 are not in contact with each other.

Next, as shown in FIG. 24, an insulating layer 81 and a sacrificial member 82 are alternately stacked on the upper surfaces of the insulating layers 76 and 79 and the sacrificial member 78 such that they cover the cell area CA and the hookup area HA. An insulating layer 81 is stacked on the upper surface of the uppermost sacrificial member 82. The insulating layers 81 contain, for example, silicon oxide ($SiO_2$), and the sacrificial member 82 contains, for example, silicon nitride (SiN).

Figure 25:
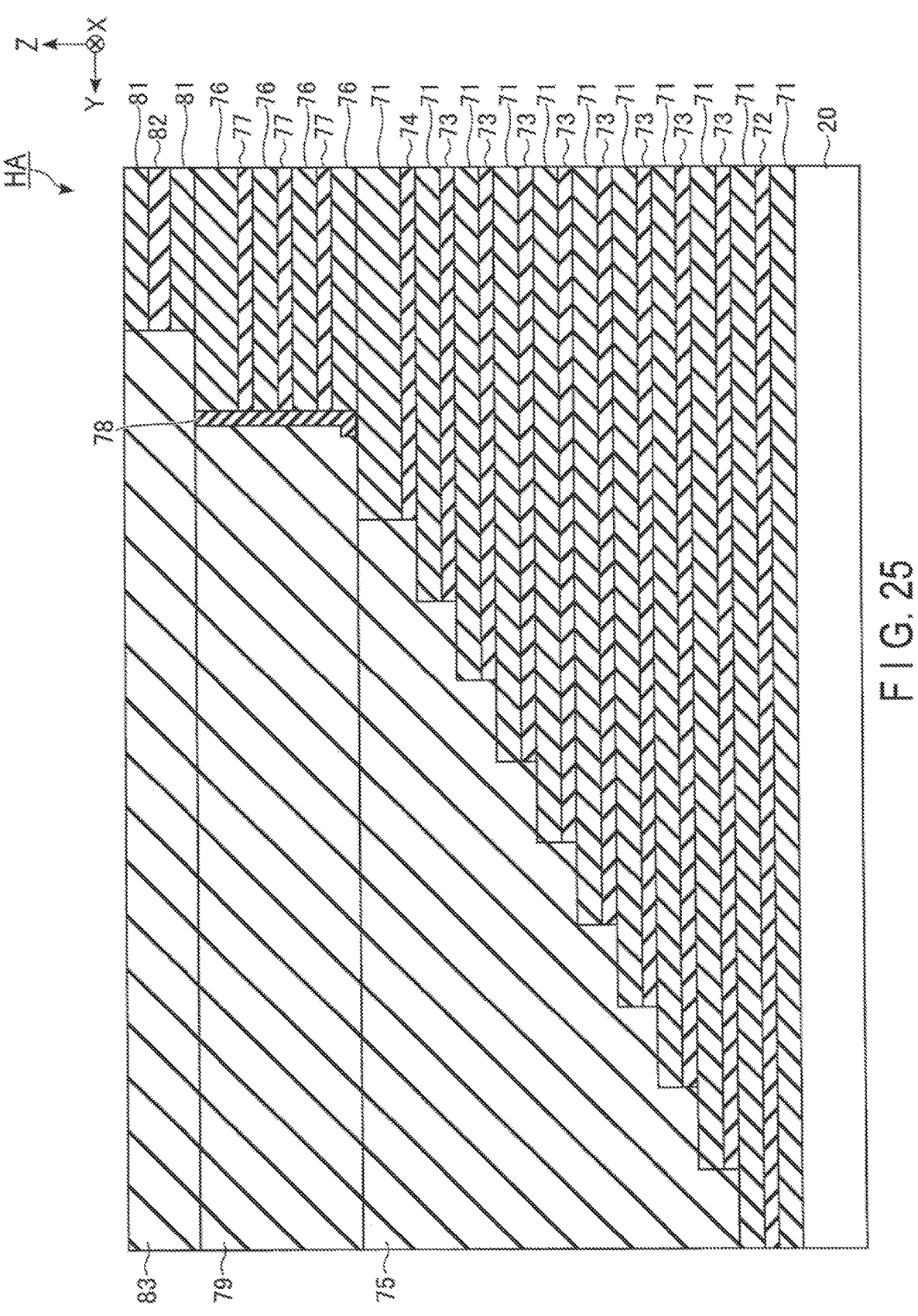
FIG. 25 is a cross-sectional view of the memory cell array for illustrating the manufacturing process of the semiconductor memory device according to the embodiment.

Next, as shown in FIG. 25, in the hookup area HA, a mask (not shown) is provided on the upper surface of the uppermost insulating layer 81, and a pattern is formed on the mask by lithography. Thereafter, based on the pattern, anisotropic etching is performed on the stacked structure of the sacrificial members 82 and the insulating layers 81. Thus, part of the insulating layer 76, the insulating layer 79 and the sacrificial member 78 are exposed in the hookup area HA. The anisotropic etching used in the present process is, for example, RIE. Thereafter, the region from which the stacked structure of the sacrificial member 82 and the insulating layers 81 is removed is buried with an insulating layer 83 up to the position of the uppermost insulating layer 81. The insulating layers 81 contain, for example, silicon oxide ($SiO_2$).

Figure 26:
FIG. 26 is a cross-sectional view of the memory cell array for illustrating the manufacturing process of the semiconductor memory device according to the embodiment.
Figure 26:

Next, as shown in FIG. 26, in the cell area CA, a hole H1 is formed above part of the upper pillar UMP that is formed by the process shown in FIG. 23. For example, the hole H1 passes through the sacrificial member 82 and reaches the lowermost insulating layer 81. Thus, the sacrificial member 82 is exposed in the hole H1. Subsequently, the sacrificial member 82 exposed in the hole H1 is oxidized to form an insulating film 44.

Figure 27:
FIG. 27 is a cross-sectional view of the memory cell array for illustrating the manufacturing process of the semiconductor memory device according to the embodiment.
Figure 27:

Next, after the insulating layer 81 at the bottom of the hole H1 is removed and the sacrificial member 80 is exposed, the sacrificial member 80 is selectively removed, as shown in FIG. 27. Thus, a hole H2 is formed, in the bottom of which the semiconductor portion 33 is exposed.

Figure 28:
FIG. 28 is a cross-sectional view of the memory cell array for illustrating the manufacturing process of the semiconductor memory device according to the embodiment.
Figure 28:

Next, as shown in FIG. 28, a semiconductor film 41 and a core film 40 are sequentially formed in the hole H2 to fill the hole H2. Thereafter, that portion of the core film 40 which is located from the upper end of the hole H2 to a predetermined depth is removed, and a semiconductor portion 45 is formed in the space from which the portion of the core film 40 is removed. In this manner, the upper pillar UMP is formed.

Figure 29:
FIG. 29 is a cross-sectional view of the memory cell array for illustrating the manufacturing process of the semiconductor memory device according to the embodiment.
Figure 29:

Next, in the cell area CA, a hole H3 is formed in the region that corresponds to the slit SLT and the contact LI, as shown in FIG. 29. The hole H3 divides the sacrificial members 72-74, 77 and 82. The bottom end of the hole H3 reaches the semiconductor substrate 20, for example. Thus, the sacrificial members 72 to 74, 77 and 82 are exposed in the hole H3.

Figure 30:
FIG. 30 is a cross-sectional view of the memory cell array for illustrating the manufacturing process of the semiconductor memory device according to the embodiment.
Figure 31:
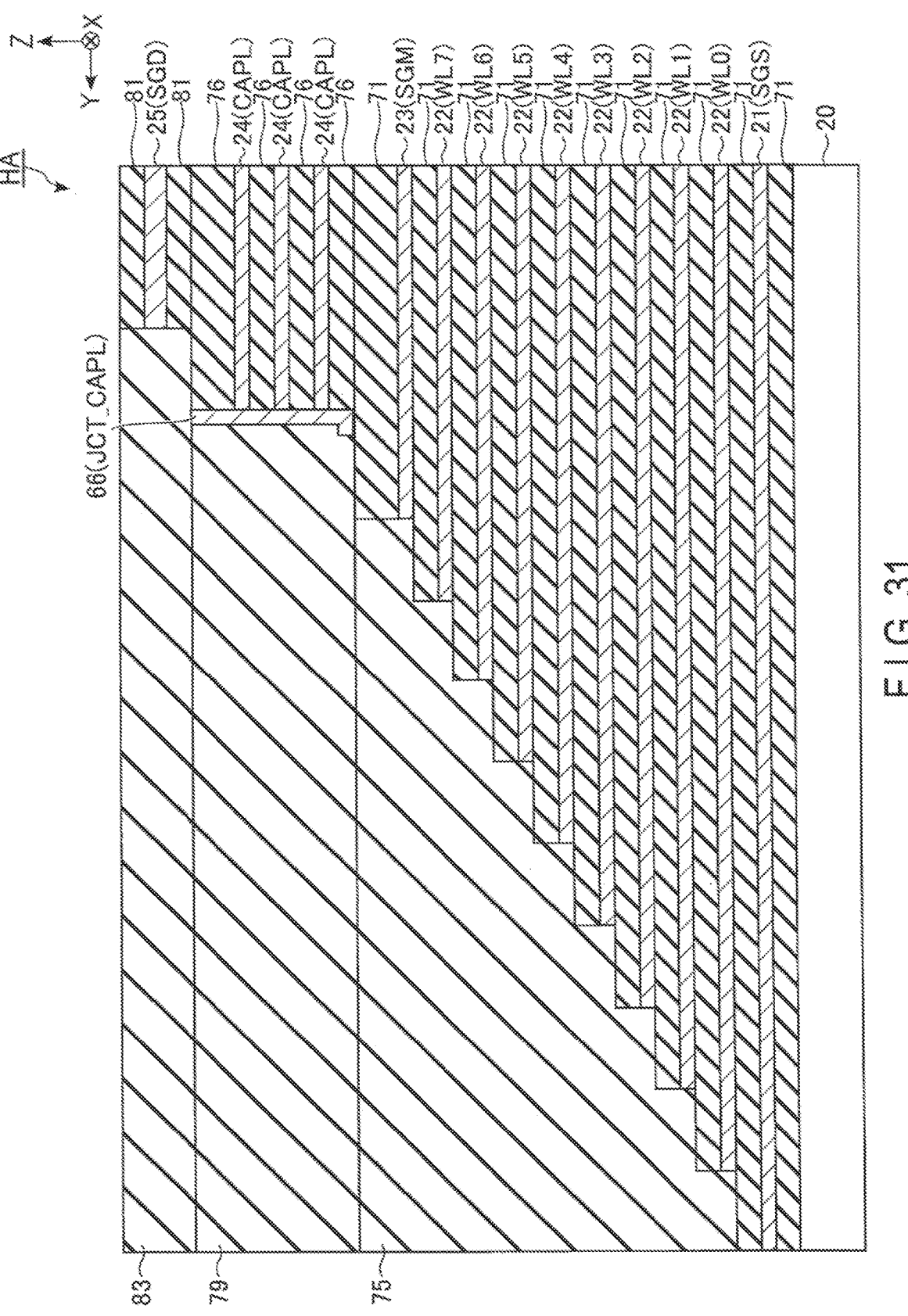
FIG. 31 is a cross-sectional view of the memory cell array for illustrating the manufacturing process of the semiconductor memory device according to the embodiment.

Next, in the cell area CA and the hookup area HA, the sacrificial members 72 to 74, 77 and 82 are replaced with conductive layers 21 to 25 and the sacrificial member 78 is replaced with the conductive film 66, as shown in FIGS. 30 and 31. Specifically, the sacrificial members 72 to 74, 77 and 82 are selectively removed, for example, by performing wet etching, using the hole H3. The sacrificial member 78 that is exposed in the hookup area HA after the sacrificial member 77 is removed is also selectively removed by the above wet etching. In the space from which the sacrificial members 72 to 74, 77, 78 and 82 are removed, conductive layers 21 to 23 and 24, a conductive film 66 and a conductive layer 25 are provided using the hole H3.

Next, as shown in FIG. 32, an insulating layer 50 is formed in the hole H3. Subsequently, the insulating layer 50 in the bottom of the hole H3 is removed, and the semiconductor substrate 20 is exposed again. Then, a conductive layer 51 is formed in the hole H3 that exposes the semiconductor substrate 20 again, and the hole H3 is filled thereby.

Next, as shown in FIG. 33, in the cell area CA, an insulating layer 84 is formed on the upper surface, and then a hole H4 is formed in the region corresponding to the slit SHE. The hole H4 divides the conductive layer 25, and the lower end of the hole H4 reaches, for example, the lowermost insulating layer 81.

Figure 34:
FIG. 34 is a cross-sectional view of the memory cell array for illustrating the manufacturing process of the semiconductor memory device according to the embodiment.

Next, as shown in FIG. 34, an insulating layer 52 is formed in the hole H4 and the hole H4 is filled thereby.

In the manner described above, a series of manufacturing steps, from the formation of the layer stack on the semiconductor substrate 20 to the formation of the slit SHE, are completed.

1.4 Advantageous Effects

According to the embodiment, the memory string MS is provided with a memory cell transistor MT coupled to a bit line BL and functioning as a NAND memory cell, and a capacitor CAP coupled between the bit line BL and the memory cell transistor MT and functioning as a DRAM memory cell. Thus, in one semiconductor memory device 1, each of the NAND memory cells and the DRAM memory cells can be accessed through the same bit line BL. Therefore, the frequency of data transfer from the DRAM memory cells to the NAND memory cells can be improved as compared with a case where the NAND memory cells and the DRAM memory cells are provided in separate semiconductor memory devices, and the storage capacity required of the DRAM memory cells of the memory system can be reduced. Accordingly, the power required for the refresh operation of the DRAM memory cells can be reduced, and an increase in power consumption can be suppressed.

The DRAM memory cells are provided above the NAND memory cells of the semiconductor substrate 20. This allows the area occupied by the DRAM memory cells in the memory system to be shared with the NAND memory cells. Thus, restrictions on the areas of the memory system can be relaxed.

The memory cell array 10 is divided into two regions, with the sense amplifier module 16 interposed therebetween. The sense amplifiers SA of the sense amplifier module 16 are coupled to the two regions of the memory cell array 10 by means of the bit lines BL and /BL. Thus, the sense amplifiers SA can read the data in the memory string MS coupled to the bit line BL, based on the comparison with the dummy memory string /dMS coupled to the bit line /BL.

Specifically, the sense amplifier SA equalizes the bit lines BL and /BL to a voltage VDD/2, and then turns on the selection transistor ST1 of the selected memory string MS. Thus, where the voltage charged in the selected capacitor CAP is equal to the voltage VDD/2 or higher, the voltage of the bit line BL can be made higher than the voltage of the bit line /BL, and where the voltage charged in the selected capacitor CAP is less than the VDD/2, the voltage of the bit line BL can be made lower than the voltage of bit line /BL. Therefore, the sense amplifier SA can determine data, based on the voltage difference between the bit line BL and the bit line /BL.

In order to accurately sense the voltage change of the bit line BL or /BL in the above read operation, the capacitance of the capacitor CAP should desirably be about 10% or more of the capacitance of the bit lines BL and /BL. That is, it is desirable to increase the capacity of the capacitor CAP as much as possible and to reduce the capacity of the bit line BL as much as possible.

According to the present embodiment, a high-K material is used for the insulating film 42 used as the capacitor CAP. Thus, the dielectric constant of the insulating film 42 can be made higher than the dielectric constant of the stacked film 32 used for the memory cell transistor MT and the dielectric constant of the insulating film 44 used for the selection transistor ST1. Therefore, for example, even if the thickness of the insulating film 42 is equal to the thicknesses of the stacked film 32 and the insulating film 44, the capacitor CAP can have such a capacitance as allows it to function as a DRAM memory cell.

The conductive layer 24 is made up of a plurality of conductive layers stacked along the Z-axis. Thus, the area of the electrodes of the capacitor CAP can be increased. Therefore, the capacitance of the capacitor CAP can be increased as compared with the case where the conductive layer 24 is made of a single conductive layer. The plurality of conductive layers 24 are commonly coupled by the conductive films 43 and 66. Thus, the plurality of conductive layers 24 can be regarded as one electrode.

2. OTHERS

In connection with the above embodiment, reference was made to a case where the memory cell array 10, the peripheral circuit PERI, the row decoder module 15 and the sense amplifier module 16 are arranged side by side along the X-axis or the Y-axis in plan view. However, this is not restrictive. For example, the peripheral circuit PERI, the row decoder module 15 and the sense amplifier module 16 may be provided between the memory cell array 10 and the semiconductor substrate 20.

In connection with the above embodiment, reference was made to the case where the dummy block dBLK is provided between the plurality of blocks BLK0 to BLKn and the sense amplifier module 16, but this is not restrictive. For example, the dummy block dBLK may be arranged such that it sandwiches the plurality of blocks BLK0 to BLKn with the sense amplifier module 16.

In connection with the above embodiment, reference was made to the case where the select gate line SGM is commonly coupled to the gates of all selection transistors ST3 of the same block BLK, but this is not restrictive. For example, like the select gate line SGD, the select gate line SGM may be provided individually for each of the string units SU0 to SU3 of the same block BLK.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first bit line;
a first memory cell transistor coupled to the first bit line;
a first capacitor coupled between the first memory cell transistor and the first bit line;
a first selection transistor serially coupling the first memory cell transistor and the first bit line; and
a second selection transistor serially coupling the first selection transistor and the first bit line,
wherein the first capacitor includes a first end coupled between the first selection transistor and the second selection transistor.

2. The semiconductor memory device according to claim 1, further comprising:
a second memory cell transistor serially coupling the first memory cell transistor and the first selection transistor.

3. The semiconductor memory device according to claim 1, further comprising:
a second bit line;
a third memory cell transistor coupled to the second bit line;
a second capacitor including a first end coupled between the third memory cell transistor and the second bit line; and
a sense amplifier coupling the first bit line and the second bit line.

4. The semiconductor memory device according to claim 3, further comprising:
the sense amplifier is configured to determine data, based on a voltage difference between the second bit line and the first bit line.

5. The semiconductor memory device according to claim 4, wherein
the data is data stored in the first capacitor.

6. The semiconductor memory device according to claim 4, wherein
the data is data stored in the first memory cell transistor.

7. The semiconductor memory device according to claim 3, wherein
the sense amplifier includes:
a first transistor including a first end coupled to the first bit line, a second end coupled to a first node, and a gate coupled to the second bit line;
a second transistor including a first end coupled to the first bit line, a second end coupled to a second node, and a gate coupled to the second bit line;
a third transistor including a first end coupled to the second bit line, a second end coupled to the first node, and a gate coupled to the first bit line; and
a fourth transistor including a first end coupled to the second bit line, a second end coupled to the second node, and a gate coupled to the first bit line.

8. The semiconductor memory device according to claim 7, wherein
the sense amplifier includes:
a fifth transistor including a first end coupled to the first node and a second end to which a first voltage is applied;
a sixth transistor including a first end coupled to the second node and a second end to which a second voltage lower than the first voltage is applied; and
a seventh transistor including a first end coupled to the first bit line and a second end coupled to the second bit line.

9. The semiconductor memory device according to claim 8, wherein
the sense amplifier is configured to determine data in accordance with whether a voltage of the first bit line is equal to or higher than an intermediate voltage between the first voltage and the second voltage.

10. A semiconductor memory device comprising:
a first structure provided above a substrate,
wherein the first structure comprises:
a plurality of first conductive layers stacked above the substrate along a first direction;
at least one second conductive layer stacked above the plurality of first conductive layers along the first direction;

a third conductive layer stacked above the at least one second conductive layer along the first direction;

a first semiconductor film extending along the first direction through the plurality of first conductive layers, the at least one second conductive layer and the third conductive layer;

a first insulating film arranged between the plurality of first conductive layers and the first semiconductor film and including a first charge storage film;

a second insulating film arranged between the at least one second conductive layer and the first semiconductor film; and a third insulating film arranged between the third conductive layer and the first semiconductor film, wherein a dielectric constant of the second insulating film is higher than a dielectric constant of the first insulating film and a dielectric constant of the third insulating film.

11. The semiconductor memory device according to claim 10, wherein an upper end of the third insulating film is aligned with an upper end of the third conductive layer, and a lower end of the third insulating film is aligned with a lower end of the third conductive layer.

12. The semiconductor memory device according to claim 10, wherein the first semiconductor film includes a first portion in contact with the first insulating film, a second portion in contact with the second insulating film and the third insulating film, and a third portion located between the first portion and the second portion, and the third portion of the first semiconductor film contains n+ type impurities.

13. The semiconductor memory device according to claim 10, further comprising:

a second structure provided above the substrate and spaced apart from the first structure, the second structure including:

a plurality of fourth conductive layers stacked above the substrate along the first direction;

at least one fifth conductive layer stacked above the plurality of fourth conductive layers along the first direction;

a sixth conductive layer stacked above the at least one of the fourth conductive layer along the first direction;

a second semiconductor film extending along the first direction through the plurality of fourth conductive layers, the at least one fifth conductive layer and the sixth conductive layer;

a fourth insulating film arranged between the plurality of fourth conductive layers and the second semiconductor film and including a second charge storage film;

a fifth insulating film arranged between the at least one fifth conductive layer and the second semiconductor film; and a sixth insulating film arranged between the sixth conductive layer and the second semiconductor film, wherein the plurality of first conductive layers, the at least one second conductive layer, the third conductive layer, the plurality of fourth conductive layers, the at least one fifth conductive layer and the sixth conductive layer extend along a second direction intersecting the first direction in a first plane parallel to the substrate, and the first structure and the second structure are arranged side by side in the first plane along a third direction intersecting the second direction.

14. A semiconductor memory device comprising:

a first structure provided above a substrate, wherein the first structure comprises:

a plurality of first conductive layers stacked above the substrate along a first direction;

at least one second conductive layer stacked above the plurality of first conductive layers along the first direction, wherein the at least one second conductive layer includes a plurality of second conductive layers;

a third conductive layer stacked above the at least one second conductive layer along the first direction;

a first semiconductor film extending along the first direction through the plurality of first conductive layers, the at least one second conductive layer and the third conductive layer;

a first insulating film arranged between the plurality of first conductive layers and the first semiconductor film and including a first charge storage film;

a second insulating film arranged between the at least one second conductive layer and the first semiconductor film;

a third insulating film arranged between the third conductive layer and the first semiconductor film; and a conductive film that is in contact with each of the plurality of second conductive layers.

15. The semiconductor memory device according to claim 14, wherein the conductive film is arranged between the plurality of second conductive layers and the second insulating film.

16. The semiconductor memory device according to claim 14, wherein the plurality of second conductive layers are arranged between the conductive film and the second insulating film.

* * * * *